US006169771B1

(12) United States Patent
Shou et al.

(10) Patent No.: US 6,169,771 B1
(45) Date of Patent: Jan. 2, 2001

(54) MATCHED FILTER FOR SPREAD SPECTRUM COMMUNICATION SYSTEMS AND HYBRID ANALOG-DIGITAL TRANSVERSAL FILTER

(75) Inventors: Guoliang Shou; Changming Zhou; Xuping Zhou, all of Tokyo (JP); Xiaoling Oin, San Jose, CA (US); Kazunori Motohashi, Tokyo (JP); Makoto Yamamoto, Tokyo (JP); Sunao Takatori, Tokyo (JP)

(73) Assignee: Yozan Inc., Tokyo (JP)

( * ) Notice: Under 35 U.S.C. 154(b), the term of this patent shall be extended for 0 days.

(21) Appl. No.: 09/014,264

(22) Filed: Jan. 27, 1998

(30) Foreign Application Priority Data

Jan. 27, 1997 (JP) .................. 9-025726
Mar. 14, 1997 (JP) .................. 9-079213

(51) Int. Cl.[7] .................. H04L 27/06
(52) U.S. Cl. .................. 375/343; 370/335; 375/143
(58) Field of Search .................. 375/343

(56) References Cited

U.S. PATENT DOCUMENTS

| | | | |
|---|---|---|---|
| 4,455,651 | * 6/1984 | Baran | 370/320 |
| 5,388,063 | 2/1995 | Takatori | 708/320 |
| 5,396,446 | 3/1995 | Shou et al. | 708/819 |
| 5,424,973 | 6/1995 | Shou et al. | 708/801 |
| 5,500,810 | 3/1996 | Shou | 708/300 |
| 5,502,664 | 3/1996 | Shou | 708/319 |
| 5,563,812 | 10/1996 | Shou | 708/7 |
| 5,686,861 | 11/1997 | Shou | 327/552 |
| 5,737,368 | 4/1998 | Shou | 375/343 |
| 5,740,096 | 4/1998 | Shou | 708/819 |
| 5,751,184 | 5/1998 | Shou | 327/552 |
| 5,781,584 | 7/1998 | Zhou | 375/150 |
| 5,790,590 | 8/1998 | Shou | 375/152 |
| 5,960,033 | * 9/1999 | Shibano et al. | 375/207 |

OTHER PUBLICATIONS

Fink and Christiansen, editors, "Electronics Engineers' Handbook" Chapter 8, McGraw–Hill Book Company, 1989.*

* cited by examiner

Primary Examiner—Stephen Chin
Assistant Examiner—Paul N. Rupert
(74) Attorney, Agent, or Firm—Pillsbury Madison & Sutro LLP

(57) ABSTRACT

In one aspect, the present invention provides a low power consumption matched filter. The signal received at an input terminal is input to a shift register having stages equal to the spread code length number after conversion into digital signals in an A/D converter. The outputs of the shift register stages are input to XOR circuits set corresponding to each stage, so that XOR operations are performed between the outputs and corresponding spread code bits $d_1$ to $d_N$. The outputs of the XOR circuits are analogously added in an analog adder and output from an output terminal. In another aspect, a filter circuit uses an analog operation circuit to prevent lowered operational accuracy caused by residual charge. Input analog signals successively undergo sampling and holding in sample-and-hold circuits, are multiplied by coefficients stored in a shift register by multiplication circuits, and added in an addition circuit. Sample data transmission error storage is prevented by shifting coefficients in the shift register. Sample-and-hold circuits and multiplication circuits are formed by analog operation circuits, and each include a switch for canceling the residual charge. The sample-and-hold circuits and multiplication circuits normally working are refreshed sequentially by providing circuits for replacing their function. The addition circuit is refreshed in the same way.

8 Claims, 17 Drawing Sheets

FIG. 16 (RELATED ART)

|  | $H_1$ | $H_2$ | $H_3$ | $H_4$ | $H_5$ | $H_6$ | $H_7$ | $H_8$ | $H_9$ | $H_{10}$ | $H_{11}$ | $H_{12}$ | $H_{13}$ | $H_{14}$ | $H_{15}$ | $H_{16}$ |
|---|---|---|---|---|---|---|---|---|---|---|---|---|---|---|---|---|
| The First Multiplication | $X_1$ $a_0$ | $X_2$ $a_1$ | $X_3$ $a_2$ | $X_4$ $a_3$ | $X_5$ $a_4$ | $X_6$ $a_5$ | $X_7$ $a_6$ | $X_8$ $a_7$ | $X_9$ $a_8$ | $X_{10}$ $a_9$ | $X_{11}$ $a_{10}$ | $X_{12}$ $a_{11}$ | $X_{13}$ $a_{12}$ | $X_{14}$ $a_{13}$ | $X_{15}$ $a_{14}$ | $X_{16}$ $a_{15}$ |
| The Second Multiplication | $X_{17}$ $a_{15}$ | $X_{18}$ $a_0$ | $X_3$ $a_1$ | $X_4$ $a_2$ | $X_5$ $a_3$ | $X_6$ $a_4$ | $X_7$ $a_5$ | $X_8$ $a_6$ | $X_9$ $a_7$ | $X_{10}$ $a_8$ | $X_{11}$ $a_9$ | $X_{12}$ $a_{10}$ | $X_{13}$ $a_{11}$ | $X_{14}$ $a_{12}$ | $X_{15}$ $a_{13}$ | $X_{16}$ $a_{14}$ |
| The Third Multiplication | $X_{17}$ $a_{14}$ | $X_{18}$ $a_{15}$ | $X_3$ $a_0$ | $X_4$ $a_1$ | $X_5$ $a_2$ | $X_6$ $a_3$ | $X_7$ $a_4$ | $X_8$ $a_5$ | $X_9$ $a_6$ | $X_{10}$ $a_7$ | $X_{11}$ $a_8$ | $X_{12}$ $a_9$ | $X_{13}$ $a_{10}$ | $X_{14}$ $a_{11}$ | $X_{15}$ $a_{12}$ | $X_{16}$ $a_{13}$ |
| ⋮ | . | . | . | . | . | . | . | . | . | . | . | . |  |  |  |  |

MATCHED FILTER FOR SPREAD SPECTRUM COMMUNICATION SYSTEMS AND HYBRID ANALOG-DIGITAL TRANSVERSAL FILTER

CROSS-REFERENCE TO RELATED APPLICATIONS

This application is related to and claims priority under 35 U.S.C. § 119 from Japanese Patent Application Nos. Hei 9-25726 and Hei 9-79213, incorporated herein by reference.

FIELD OF THE INVENTION

The present invention relates to filter circuits and in particular, to a matched filter for detecting the correlation between an input signal and a predetermined code sequence and to a filter circuit constituted by analog operation circuits.

BACKGROUND OF THE INVENTION

A Direct Sequence (DS) Spread Spectrum (SS) communication system performs acquisition which estimates within 1-chip, the timings of signal spread code sequences. It then synchronizes the operation of spread code generator in a receiver to the estimated timing.

There are two methods of performing this acquisition, namely by using (1) sliding correlators and (2) a matched filters.

Method (1) generates spread codes by roughly estimated timing and tries to receive them by gradual shifting. It multiplies a received signal and the spread code generated in the receiver and passes the result through a low-pass filter. Although the output of the low-pass filter has a large amplitude when phases of a received signal spread code and spread code being generated are identical, it has a low-level signal given by the auto-correlation function when the phases are not identical. Therefore, when the low-pass filter output is smaller than the predetermined level, the spread code phase generated by the spread code generator is slightly advanced or delayed. Repeating this identifies the phases of the transmission signal spread code and of the spread code generated in a receiver.

This method identifies phases by shifting the spread code generator phase by the time corresponding to one spread code cycle at most. When the spread code generator is working in a phase, it takes a single spread code cycle to ascertain if it is the correct phase. It means that this method needs the time of (one spread code cycle)×(spread code length) at most until acquisition is completed.

Method (2) detects correlation values using matched filter, which soon completes acquisition. When spread spectrum modulated signals are continuously input from the receiving side of a matched filter, every moment's correlation value appears in succession at the output side of the filter. Therefore, the correlation value peak can be detected by watching the matched filter outputs during one spread code cycle. Using this method completes acquisition in the time corresponding to one spread code cycle.

FIG. 5 shows an example of a conventional matched filter with a spread code length of N bits. In FIG. 5, 110 is an input terminal, and $120_1$ to $120_{N-1}$ are delay circuits for delaying input signals by unit time τ. Delay circuits $120_1$ to $120_{N-1}$ are serially connected so that signals from 110 are sequentially delayed. Input signal X(t−iτ), which is iτ time before the present time, is output from $120_i$ (i=1 to N−1) at the timing input terminal 110 receives signal X(t).

Numbers $130_0$ to $130_{N-1}$ show multiplication circuits which multiply signals X(t−iτ) (i=0 to N−1) output from 110 or $120_1$ to $120_{N-1}$ and bit di (i=0 to N−1) corresponding to the spread code produced by a spread code generator (not shown). Bit di is +1 or −1. The received signal is output as it is when the bit corresponding to the spread code is +1, and it is output with inverted polarity when the bit is −1.

Outputs from $130_0$ to $130_{N-1}$ are added by adder 140 and output from output terminal 150. This terminal 150 outputs correlation output Y(t) shown in Equation (1):

$$Y(t) = \sum_{i=0}^{N-1} di \cdot X(t - i\tau) \tag{1}$$

Observing Y(t) during a single spread code cycle yields the correlation peak between the input signals and the spread codes, and rapid acquisition is thus possible.

To form a matched filter like this, an analog delay line using a charged couple device (CCD) or a surface acoustic wave (SAW) device, and a digital circuit in which the shift register works as a delay circuit by converting received signals into digital data are used.

Acquisition using a sliding correlator requires little electric power consumption per unit time, but takes a long time to complete. There is heavy power consumption when acquisition is continuous.

Acquisition using a matched filter is completed in a short time. When an analog matched filter is used, electric power consumption is small but computation accuracy varies. When a digital filter is used, the circuit size is large and electric power consumption is also large because many multiplications and additions have to be performed. With double sampling there is a larger sampling number and so a large circuit size, a serious problem affecting matched filter use in portable communication terminals.

On another point, a transversal filter is conventionally formed by discretely multiplying sequential sampled data by a predetermined coefficient and adding the products. Since this type of filter usually transfers analog signals sampled and held in sequence, the process stores analog data holding errors. To minimize these errors, a filter circuit which stores each coefficient in a cyclic shift register and circulates them instead of transferring the sampled analog data has been proposed in Japanese Patent Laid-Open Publication No. Hei 6-164320.

FIG. 15 shows an example of such a filter circuit. In FIG. 15, HG1 is a first sample-and-hold circuit group including eight sample-and-hold circuits $H_1$ to $H_8$, which are connected to input terminal Din, and HG2 is a second sample-and-hold circuit group including eight sample-and-hold circuits $H_9$ to $H_{16}$, which are connected to output D'in of multiplexer MUX. This system includes sixteen sample-and-hold circuits $H_1$ to $H_{16}$. $H_1$ to $H_{16}$ sample and hold analog signals input from Din or D'in according to the predetermined sampling signals, and store the sampled data until the next sampled signals are supplied.

MUX is provided between HG1 and HG2 to select Din or the output of holding circuit Hout (described later) as D'in.

SR is the 16-stage of cyclic shift register, and each stage $A_1$ to $A_{16}$ stores the predetermined coefficients $a_0$ to $a_{15}$ that are to be multiplied by discrete analog input signals respectively sampled and held by $H_1$ to $H_{16}$. The memory is sequentially circulated by sampling signals (not shown) and shift-clock synchronized to the sampling signals.

$M_1$ to $M_{16}$ are multiplication circuits, each of whose first input terminal receives a discrete signal from $H_1$ to $H_{16}$, and whose other input terminal is connected to corresponding stage $A_1$ to $A_{16}$, respectively. This configuration multiplies the discrete analog signals output from $H_1$ to $H_{16}$ by digital data $a_0$ to $a_{15}$ from $A_1$ to $A_{16}$ in $M_1$ to $M_{16}$, respectively.

The multiplication results output from $M_1$ to $M_{16}$ are added in addition circuit AD, and their sum is output to holding circuit Hout. The output of Hout is also that of this filter circuit as well as another input of MUX.

The filter circuit having this structure works as described below when MUX connects Din and HG2.

$H_1$ to $H_{16}$ are sequentially driven by every sampling cycle to sample and store analog input signals from Din. That is, at the first sampling timing, $H_1$ is driven and the input signal then is sampled and held in $H_1$. At the next sampling timing, H2 is driven and the input signal then is sampled and held in $H_2$. In this way, input signals are successively sampled and held in $H_3$ to $H_{16}$ at every sampling timing. After sampling data is held in $H_{16}$, input signals are successively sampled and held from $H_1$. Repeating this, all the necessary sequential data can be sampled and held by the predetermined timing without transferring data between sample-and-hold circuits.

When analog signals from Din are successively sampled and sixteen sequential data are held in $H_1$ to $H_{16}$ as above, coefficients $a_0$ to $a_{15}$ stored in SR and the sequential data in $H_1$ to $H_{16}$ are multiplied in $M_1$ to $M_{16}$, respectively, as described above. Then the multiplied results from $M_1$ to $M_{16}$ are added in AD and the sum is stored in Hout.

When new sequential data is sampled and held in $H_1$ in any subsequent sampling timing, the multiplication coefficients stored in SR are circularly shifted. These circularly-shifted multiplication coefficients and the sequential data stored in $H_1$ to $H_{16}$ are multiplied as described.

FIG. 16 shows the relationship between sequential data $x_i$ stored in $H_1$ to $H_{16}$ and multiplication coefficients $a_0$ to $a_{15}$ stored in SR. As shown in FIG. 16, $a_0$ to $a_{15}$ are shifted to the next stage, and the coefficient at the last stage is returned to the first stage at every sampling of new sequential data. This makes it possible to execute an operation equivalent to shifting data $x_i$ itself, which is held in the conventional structure, and to avoid holding errors caused by transferring sampled analog data.

When the multiplexer selects Din, this filter circuit functions as an FIR filter to execute the operation shown in Equation (2):

$$Y(t) = \sum_{i=0}^{15} a_{15-i} X(t-i) \tag{2}$$

Here, Y(t) is the output, X(t) is the input, and $a_i$ is the coefficient.

When the output of Hout is selected as D'in, this filter circuit functions as an IIR circuit to execute the operation in Equation (3):

$$Y(t) = \sum_{i=0}^{7} a_{7-i} X(t-i) + \sum_{i=0}^{7} b_{7-i} Y(t-1-i) \tag{3}$$

Y(t) is the output, X(t) is the input, $a_i$ and $b_i$ are the coefficients. In this case, SR is divided into two shift registers with eight stages to store $a_i$ and $b_i$.

This filter circuit realizes FIR and IIR filters by switching MUX: when the FIR filter is actualized, many stages can be included utilizing all sample-and-hold circuits and multiplication circuits. The circuit features low power consumption and high-speed operation using an analog operation circuit (a neural operation circuit which is described below) having sample-and-hold circuits $H_1$ to $H_{16}$, multiplication circuits $M_1$ to $M_{16}$, and addition circuit AD.

This neural operation circuit is described with reference to FIGS. 17(a) and 17(b). FIG. 17(a) shows the fundamental structure of this neural operation circuit, where V1 and V2 are input terminals and INV is an inverting amplifier. INV utilizes the characteristics of a CMOS inverter at its output transit from high-level to low-level or from low-level to high-level to use an inverter as an amplifier: it has an odd number of CMOS inverters in a serial array, with three stages 92, 93 and 94 being shown, for example. Resistances R1 and R2 and capacitor Cg are set for controlling the amplifier gain and for adjusting phase, respectively, to prevent the oscillation of INV.

Input capacitors $C_1$ and $C_2$ are serially connected between $V_1$ and point B at the input of INV and between $V_2$ and point B, respectively. Feedback capacitor Cf is set and connected between output terminal Vo of INV and point B.

In a circuit with such a structure, the voltage-amplifying ratio of INV is very large, and the voltage at B is approximately constant and assumed to be Vb. Point B is connected to $C_1$, $C_2$, Cf and the gate of the transistors 92, and B is also floating from the supply voltage.

When the electric charge stored in each capacitor at the initial state is 0, the total charge stored in each capacitor referencing B is 0, even after $V_1$ and $V_2$ are input. From this, Equation (4) is true:

$$C1(V1-Vb)+C2(V2-Vb)+Cf(Vo-Vb)=0 \tag{4}$$

Here, replacing $V_1$ and $V_2$ with the reference voltage Vb at point B, $V(1)=V_1-Vb$, $V(2)=V_2-Vb$, and Vout=Vo−Vb, and Equation (5) is derived from Equation (4):

$$Vout = -\left(\frac{C_1}{Cf}V(1) + \frac{C_2}{Cf}V(2)\right) \tag{5}$$

The neural operation circuit outputs the output voltage Vout with its value multiplied by the coefficient $C_i$/Cf, which is the ratio of input capacitor $C_i$ and feedback capacitor Cf, and with inverted polarity. Equation (6) describes Vout:

$$Vout = -\left(\frac{C_1}{Cf}V(1) + \frac{C_2}{Cf}V(2) + ... \frac{C_i}{Cf}V(i) + ... \frac{C_n}{Cf}V(n)\right) \tag{6}$$

The dynamic range is maximized by setting voltage Vb at B to be half of the supply voltage, and Vb=Vdd/2, accordingly.

In FIG. 17(a), controlling the gain of 93 using R1 and R2 prevents oscillation in INV. Other structures can also prevent such oscillation.

FIG. 17(b) shows an exemplary configuration having this function. In this configuration, INV connects a serial circuit including resistance R and capacitor C between the input and output of CMOS inverter 93 that is set in a portion prior to the last stage. This serial circuit controls the gain of INV because it works as a negative feedback circuit of CMOS inverter 93 and works as its load. Therefore, this circuit forms a neural operation circuit consuming less power than that in FIG. 17(a).

FIG. 18 shows an exemplary structure of a sample-and-hold circuit using this neural operation circuit. In FIG. 18, Vin is the input voltage, SW is a sampling switching circuit, Cin is an input capacitor serially connected to the input of INV, Cf is the feedback capacitor in FIG. 17(*a*), and Vout is the output voltage. Here, Cin and Cf have the same capacity, and SW includes a switching circuit using an MOS transistor like a CMOS transmission gate, for example.

As is clear from FIG. 18, this sample-and-hold circuit is identical to there being only one input terminal in the neural operation circuit in FIG. 17(*a*). As Cin and Cf have the same values, the output voltage Vout is equal to −Vin from Equation (5). The inverted input voltage while the circuit open is output from the output terminal of this sample-and-hold circuit by closing SW first, and then opening it on the sampling timing: the voltage is held as it is until the sampling switch is closed.

FIG. 19 shows an exemplary multiplication circuit using this neural operation circuit. In FIG. 19, Vin is the input voltage, Vref is the reference potential, and Vref=Vdd/2=Vb. $MUX_1$ to $MUX_n$ are the multiplexers for switching the inputs to capacitors, whose first input terminals are connected to Vin and whose second input terminals are connected to Vref, and whose output terminals are connected to input capacitors $C_1$ to $C_n$, respectively. $MUX_1$ to MUXn receive control signals $d_1$ to $d_n$, respectively: when $d_i$ (i=1 to n) is 1, input voltage Vin which is transmitted to the first input terminal is selected to be sent to corresponding input capacitor $C_i$, and when $d_i$ is 0, Vref (=Vb) is selected.

The other sides of $C_1$ to $C_n$ are connected to point B at the input of INV, and feedback capacitor Cf is connected between the input and output of INV.

$C_1$ to $C_n$ are set to satisfy Equation (7), that is, the ratios of $C_1$ to $C_n$ are the second power:

$$C_n = 2C_{n-1} = \ldots 2^i C_{n-i} = \ldots 2^{n-1} C_1 \quad (7)$$

Electrical charge retention Equation is shown in Equation (8):

$$\sum_{i=1}^{n} C_i d_i (Vin - Vb) + \sum_{i=1}^{n} C_i (1 - d_i)(Vref - Vb) + Cf(Vout - Vb) = 0 \quad (8)$$

As Vref=Vb, Vout is expressed in Equation (9):

$$Vout = -\frac{1}{Cf} \sum_{i=1}^{n} C_i d_i Vin = -\frac{C_1}{Cf} Vin \sum_{i=1}^{n} 2^{i-1} d_i \quad (9)$$

That is, the multiplication results of Vin and n-bit binary numbers, each of whose bits corresponds to $d_1$ to $d_n$, are output as output voltage Vout.

Therefore, this circuit directly multiplies the n-bit digital coefficient by the analog voltage, setting the coefficient data stored in stage $A_1$ of shift register SR in FIG. 15 as the control signal and the output from H1 as the input voltage Vin for transmitting.

FIG. 20 shows an exemplary addition circuit using the neural operation circuit above. In FIG. 20, $p_1$ to $p_{16}$ and $m_1$ to $m_{16}$ are input terminals, $C_{p1}$ to $C_{p16}$ are input capacitors connected to $p_1$ to $p_{16}$, respectively, and $C_{m1}$ to $C_{m16}$ are input capacitors connected to $m_1$ to $m_{16}$, respectively. This is only one example, and there can be any number of input terminals.

In FIG. 20, INV1 is a first inverting amplifier, INV2 is a second inverting amplifier, $B_1$ and $B_2$ are points at the inputs of INV1 and INV2, respectively, $O_1$ is a point at the output of INV1, $Cf_1$ and $Cf_2$ are feedback capacitors of INV1 and INV2, respectively, and Cc is a capacitive coupling set between $O_1$ and $B_2$. Each of $C_{p1}$ to $C_{p16}$ and $C_{m1}$ to $C_{m16}$ is set equal to be Cin, and $Cc = Cf_1 = Cf_2$.

In this configuration, when the input voltage magnitude input to $p_1$ to $p_{16}$ is assumed to be $V_{p1}$ to $V_{p16}$, respectively, and output voltage $V_{O1}$ is generated at $O_1$, Equation (10) is derived from Equation (6):

$$V_{O1} = -\left(\frac{C_{p1}}{Cf_1} V_{p1} + \frac{C_{p2}}{Cf_1} V_{p2_1} + \ldots \frac{C_{pi}}{Cf_1} + \ldots \frac{C_{pn}}{Cf_1} V n1\right) \quad (10)$$

$$= \frac{Cp1}{Cf1}(V_{p1} + V_{p2} + \ldots V_{pi_1} + \ldots V_{pn_1})$$

When the input voltage transmitted to $m_1$ to $m_{16}$ is $V_{m1}$ to $V_{m16}$, output voltage Vout is obtained at the output terminal of INV2 as shown in Equation (11):

$$Vout = -\left(\frac{C_c}{Cf_2} V_{O1} + \frac{C_{m1}}{Cf_2} V_{m1} + \ldots \frac{C_{m2}}{Cf_2} V_{m2} + \ldots \frac{C_{mn}}{Cf_2} V_{mn}\right) \quad (11)$$

$$= -V_{O1} - \left(\frac{C_{m1}}{Cf_2} V_{m1} + \frac{C_{m2}}{Cf_2} V_{m2} + \ldots \frac{C_{mn}}{Cf_2} V_{mn}\right)$$

$$= -\frac{C_{p1}}{Cf_2}(V_{p1} + V_{p2} + \ldots V_{pn} - V_{m1} - V_{m2} - \ldots V_{mn})$$

That is, output voltage Vout of this addition circuit is $(C_{p1}/Cf_2)$ times as large as the voltage obtained by adding $V_{p1}$ to $V_{p16}$ from $p_1$ to $p_{16}$ and subtracting $V_{m1}$ to $V_{m16}$ from $m_1$ to $m_{16}$.

In the filter circuit in FIG. 15, necessary addition results can be obtained by respectively transmitting the output of $M_i$ and the reference potential Vref (=Vb) to input terminals $p_i$ and $m_i$ when coefficient $a_j$ of SR corresponding to the output of i-th sample-and-hold circuit $H_i$ is positive, and by respectively transmitting Vref and the output of $M_i$ to $p_i$ and $m_i$ when $a_j$ is negative.

Using a neural operation circuit like that above forms a high-speed, low power consumption filter circuit. However, any analog operation circuit like this present neural one generates a residual charge in its inverter or a capacitor while operating, and the offset voltage so generated decreases the output accuracy of the circuit.

SUMMARY OF THE INVENTION

In view of the above problems of the prior art, a first object of the present invention is to provide a matched filter having both analog and digital merits, small circuit-size, and low electric power consumption.

To achieve the above object, a matched filter according to a preferred aspect of this invention includes an analog-to-digital converter for sampling and converting an input signal into predetermined digital data, a shift register having a predetermined number of stages for receiving the output of the analog-to-digital converter, an EXCLUSIVE-OR circuit corresponding to each stage of the shift register, for performing EXCLUSIVE-OR operations between the predetermined bits of digital data output from the stage corresponding to the shift register and its corresponding bit of spread code; and an adder for adding the outputs of each EXCLUSIVE-OR circuit.

The analog adder is configured by analog addition circuits with the number corresponding to the bit numbers of the digital data for receiving bits with weights corresponding to the output of those from each EXCLUSIVE-OR circuit, and analog adders for giving corresponding weights to add to the outputs from each analog adder.

The analog-to-digital converter includes a predetermined number of threshold circuits including a capacitive coupling and an inverting amplifier, and an encoder for receiving the outputs of the predetermined number of threshold circuits.

Since the present matched filter employs a shift register as a delay circuit, it does not store errors during delay processing, and electric power consumption is low. Also, since EXCLUSIVE-OR circuits perform multiplications in this matched filter, a multiplication circuit can be formed very easily. Moreover, as this matched filter uses analog adders for adding input digital signals in analog fashion, it performs operations with low electric consumption, at high speed, and with high accuracy.

Another object of the present invention is to prevent decreased output accuracy caused by the residual charge in a filter circuit using an analog operation circuit.

To achieve the above object, a filter circuit according to another aspect of the present invention includes multiple sample-and-hold circuits for successively performing sampling and holding of input analog signals, a cyclic shift register storing coefficient data in each stage, multiple analog multiplication circuits for multiplying the output signals from the multiple sample-and-hold circuits and coefficient data from the cyclic shift register, and an analog addition circuit for calculating the multiplication circuits' output sum, where the multiple sample-and-hold circuits, multiplication circuits and addition circuits include a refreshing section for canceling offset voltage caused by the residual charge.

In this filter circuit, an auxiliary sample-and-hold circuit, an auxiliary multiplication circuit and an auxiliary addition circuit are provided and replace the sample-and-hold circuits, the multiplication circuits and the addition circuits, respectively, during refreshing.

The auxiliary sample-and-hold circuit and the auxiliary multiplication circuit are commonly provided in the multiple sample-and-hold circuits and multiple multiplication circuits, respectively.

The auxiliary sample-and-hold circuit, auxiliary multiplication circuit and auxiliary addition circuit constitute refreshing means for canceling offset voltage caused by the residual charge.

The sample-and-hold circuit, the multiplication circuits, the addition circuits, the auxiliary sample-and-hold circuit, the auxiliary multiplication circuit and auxiliary addition circuit each include an inverting amplifier having an odd number of stages of serially-connected CMOS inverters, an input capacitor connected to the input of the inverting amplifier, and a feedback capacitor connected between the input and output of the inverting amplifier. The refreshing means includes a switching means for short-circuiting the feedback capacitor and a means for supplying the reference voltage to the input of the input capacitor.

Also, the sample-and-hold circuits, the multiplication circuits, the addition circuits, the auxiliary sample-and-hold circuit, the auxiliary multiplication circuit and auxiliary addition circuit each includes an inverting amplifier having an odd number of stages serially-connected CMOS inverters, an input capacitor connected to the input of the inverting amplifier, and a feedback capacitor connected between the input and output of the inverting amplifier. The refreshing means includes a switching means for short-circuiting the feedback capacitor and a means for supplying the reference voltage to the input of the input capacitor and the output of the feedback capacitor.

The refreshing means maintains output accuracy against the offset voltage of the residual charge. Since the common auxiliary sample-and-hold circuit and multiplication circuit are respectively set for the multiple sample-and-hold circuits and multiplication circuits, the latter are sequentially refreshed without impeding normal work, and necessary hardware is minimally increased.

BRIEF DESCRIPTION OF THE DRAWINGS

FIG. 16 shows actions of the filter circuit in FIG. 15;

PREFERRED EMBODIMENTS OF THE PRESENT INVENTION

Figure 1:
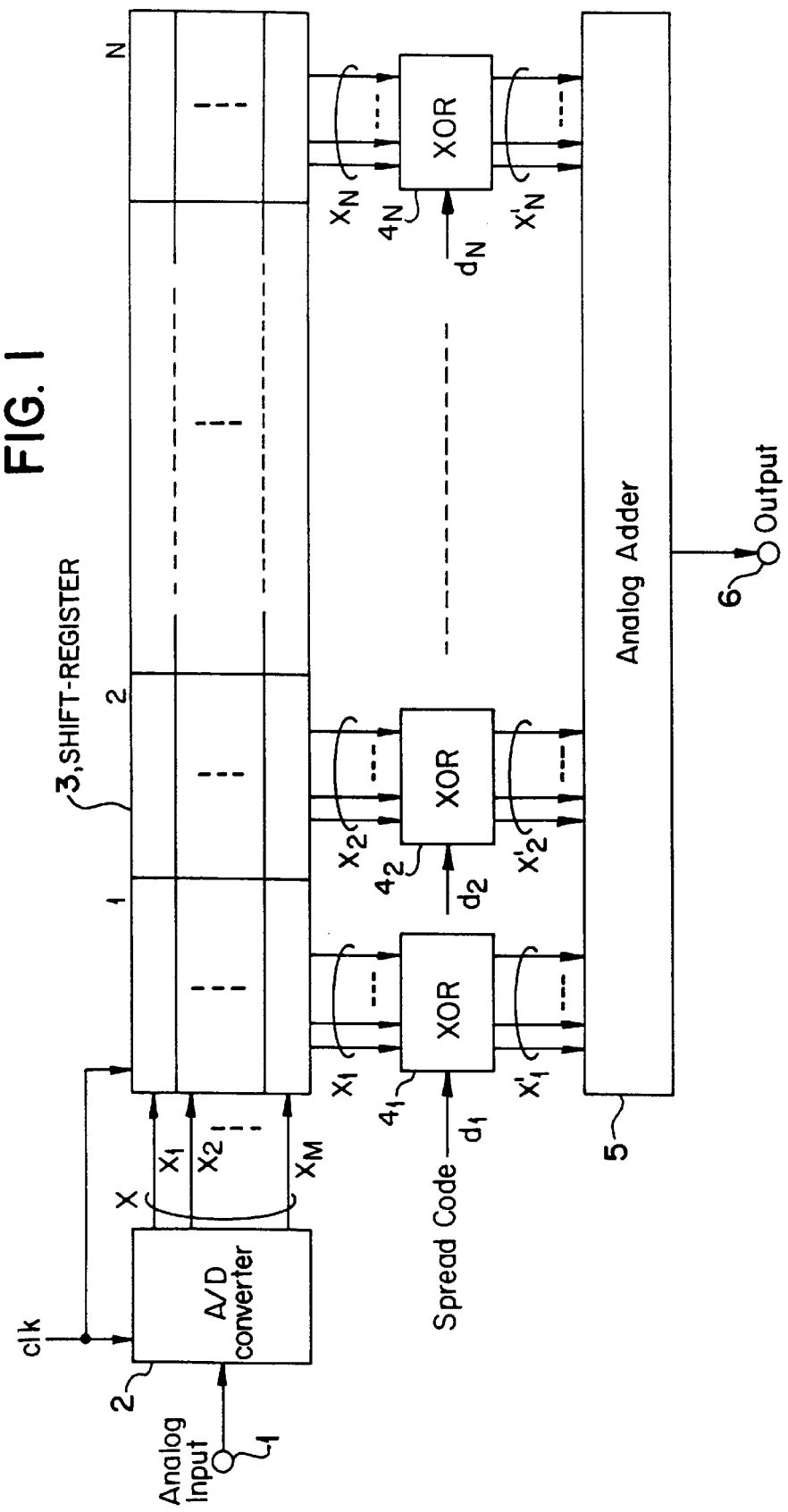
FIG. 1 shows a block diagram of a matched filter according to a first preferred embodiment of the present invention.

FIG. 1 shows a block diagram of a matched filter circuit according to the present invention. In FIG. 1, reference numeral 1 denotes an input terminal to receive analog signals, reference numeral 2 denotes an analog-to-digital converter for converting analog signals input to digital data of 1 to M-bits after sampling according to sampling clock clk, and reference numeral 3 denotes an N-stage shift register for storing M-bit digital data from A/D converter 2 in each stage at every sampling timing. Reference numerals $4_1$ to $4_N$ denote EXCLUSIVE-OR circuits (XOR-circuits) set to correspond to each stage of shift register 3, perform XOR-operations between the M-bit digital data and the corresponding bit of the spread code generated by a spread code generator (not shown), and reference numeral 5 denotes an analog adder for adding the outputs of $4_1$ to $4_N$.

The present matched filter samples a signal input from 1 by every clk in the A/D converter 2, and converts it into M-bit digital data X ($x_1, x_2, \ldots x_M$). Hereinafter, X denotes sampled digital data, and $x_1, x_2, \ldots x_M$ denote individual bits of the digital data. Analog-to-digital converter 2 outputs M-bit digital data X obtained by quantizing received signals from negative maximal value to positive maximal value in $2^M$ stages.

The bit number M of X can be any number according to the usage, but usually it is from 1 to 4 bits. A small bit number makes the circuit size small; for example, to perform acquisition of DS-CDMA, necessary accuracy can be obtained even when M=1.

X output from A/D converter 2 is input to shift register 3, clk is input to shift register 3 as a shift clock, and X is shifted to the following stages in sequence according to clk. The number of stages N of shift register 3 is equal to one cycle of spread code. The output of each stage is expressed by Xi (i=1 to N), each of which is configured by each bit of $x_{i1}, x_{i2}, \ldots x_{iM}$.

The output of each stage of shift register 3, $X_1$ to $X_N$ is then sent to a corresponding input of XOR gates 4, $4_1$ to $4_N$. Corresponding spread code bits di (i=1 to N), or their inverted bits, are each sent to another input of XOR gates $4_1$ to $4_N$. In XOR gate 4i, an XOR operation is executed between M-bit digital data Xi output from each stage of shift register 3 and di corresponding to the spread code. Here, di is 1 or 0: Xi is output as it is when di=0, and each bit ($x_1, x_2, \ldots x_M$) of Xi is inverted to output when di=1. In short, output X'i of XOR gate 4i is the inverted value of input Xi when di=1, and Xi is output as it is when di=0. In this way, di and Xi are multiplied in XOR gates $4_1$ to $4_N$.

The multiplied result data X'i (i=1 to N) from XOR gates $4_1$ to $4_N$ are input to analog adder 5 to be analogously added; consequently, correlation output voltage Y(t) is obtained at output terminal 6 as shown in Equation (1).

Figure 2:
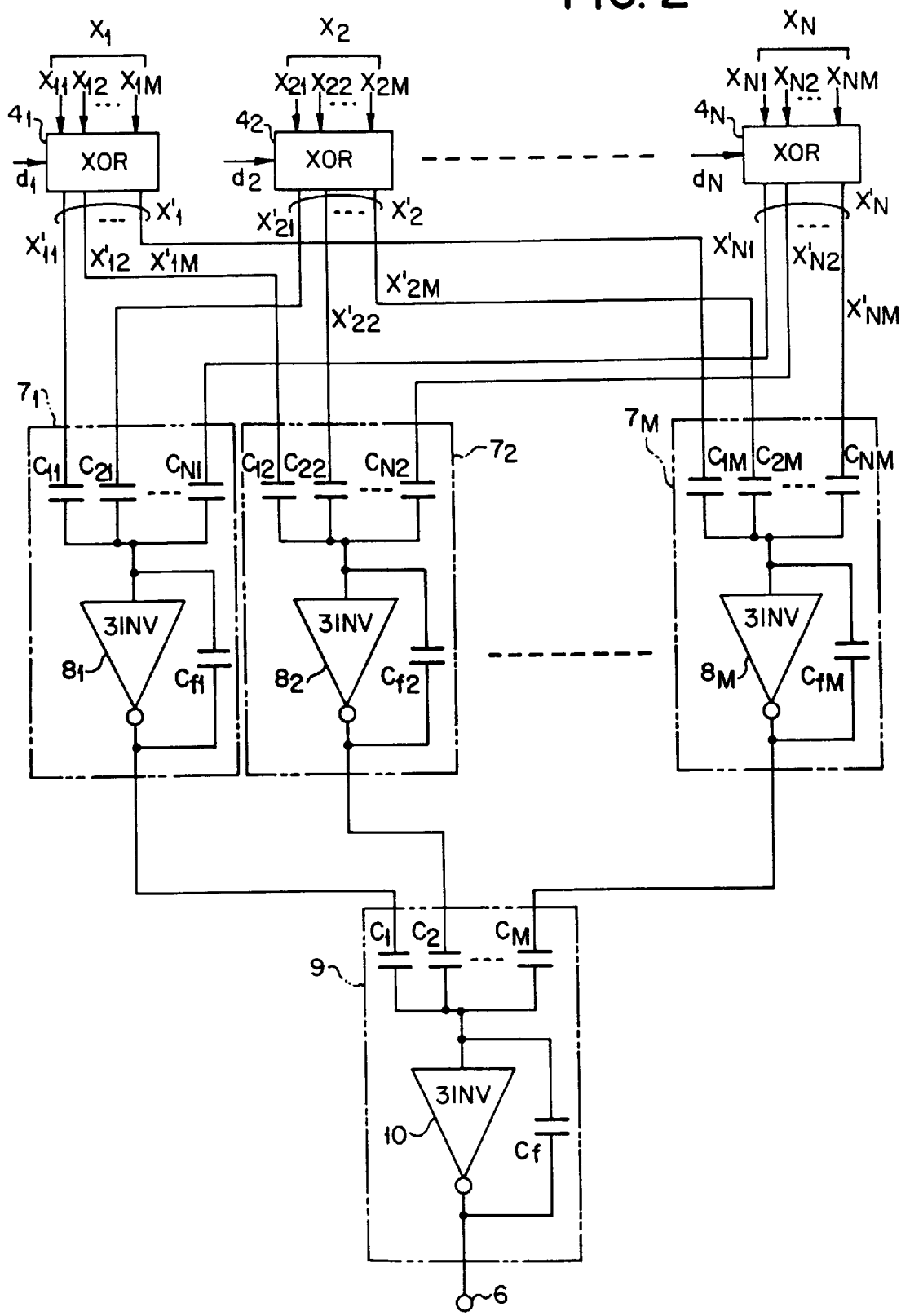
FIG. 2 shows a block diagram of the structure of the analog adder used in the matched filter according to the first embodiment.

FIG. 2 shows an exemplary embodiment of analog adder 5, where gates $4_1$ to $4_N$ are XOR-circuits which receive signals $X_1$ to $X_N$ from corresponding stages of the shift register 3, respectively. $X_1$ to $X_n$ are M-bit data, as already described, and data $X_i$ has bits from $x_{i1}$ to $x_{iM}$. $x_{i1}$ is the first bit (the lowest bit), $x_{iM}$ is the M-th bit (the uppermost bit), and the bit weight of each bit is $2^0, 2^1, \ldots 2^{M-1}$.

To recapitulate, XOR-operations between Xi and corresponding bit $d_i$ to $d_N$ are performed in XOR gates $4_1$ to $4_N$, from which corresponding output X'1 to X'N are output. X'i is the M-bit data of $x'_{i1}, x'_{i2}, \ldots x'_{iM}$.

Each bit $x'_{i1}$ to $x'_{iM}$ of signal $X'_i$ is input to adders $7_1$ to $7_M$ set corresponding to each bit weight. That is, with respect to outputs $X'_1$ to $X'_N$ of XOR gates $4_1$ to $4_N$, each first bit $x'_{11}, x'_{21}, \ldots x'_{N1}$ is input to adder $7_1$, each second bit $x'_{12}, x'_{22}, \ldots x'_{N2}$ is input to adder $7_2$, and in the same way, every bit is input to the adder $7_j$ (j=1 to M) corresponding to the bit location.

Each adder $7_j$ (j=1 to M) includes N input capacitances $C_{1j}$ to $C_{Nj}$. The outputs of each bit from gates $4_1$ to $4_N$ are connected to the corresponding input capacitance $C_{ij}$ in the corresponding adder.

As shown, inverting amplifiers $8_1$ to $8_M$ indicated by 3INV are set in adders $7_1$ to $7_M$. $C_{1j}$ to $C_{Nj}$ are connected to the input of corresponding amplifier $8_j$. The output of amplifier $8_j$ is also the output of adders $7_j$, and feedback capacitance $C_{fj}$ is connected between each input and output of inverting amplifier $8_j$.

The outputs of adders $7_1$ to $7_M$ are input to respective input capacitances $C_1$ to $C_M$ of adder 9. In the same way as in adders $7_1$ to $7_M$, input capacitances $C_1$ to $C_M$ in adder 9 are connected to the input of inverting amplifier 10, and feedback capacitance Cf is connected between the input and output of amplifier 10. The output of amplifier 10 is connected to output terminal 6.

As expressed, amplifiers $7_1$ to $7_M$ and 9 have the same structures and functions which are described in detail with reference to FIG. 3.

Figure 3:
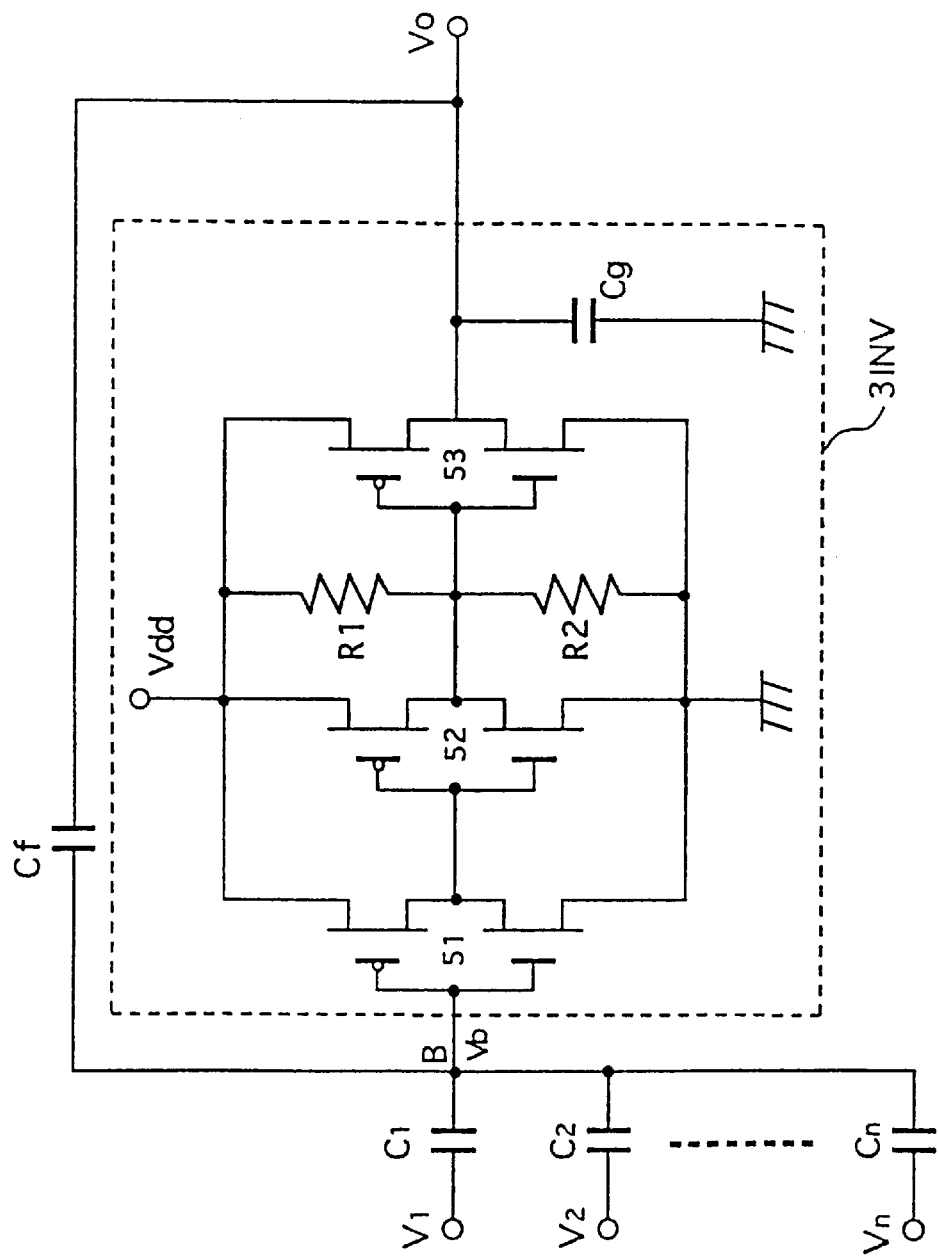
FIG. 3 shows the operation circuit configuration of the analog adder in FIG. 2.

In FIG. 3, $V_1, V_2, \ldots V_n$ are input terminals, Vo is an output terminal, and 3INV is the inverting amplifier. This inverting amplifier 3INV utilizes the characteristics of CMOS inverters in its output transit from high-level to low-level or from low-level to high-level to use the inverter as an amplifier. It includes an odd number of serially connected CMOS inverters, with CMOS inverters 51, 52 and 53 being shown in FIG. 3.

C1 to Cn are input capacitances provided between respective input terminals $V_1$ to $V_n$ and point B of the input of 3INV, and Cf is a feedback capacitance connected between Vo and point B. Resistances R1 and R2 are set to control the amplifier gain, and capacitance Cg is set to adjust the phase, not to prevent the oscillation of 3INV.

In this adder, the voltage Vb at point B is approximately constant because the gain of 3INV is very large. Here, point B is connected to capacitances C1 to Cn, to Cf and to the transistor gate forming CMOS inverter 51, and is floating from all the voltage supply.

At the initial state, assuming the electric charge stored in each capacitance is 0, and when the reference level is set at B, the total electric charge stored in each capacitance is 0, even when $V_1$ to $V_n$ are input. From this, electrical charge retention Equation (2) is true:

$$C_1(V_1-Vb)+C_2(V_2-Vb)+ \ldots C_n(V_n-Vb)+Cf(Vo-Vb)=0 \qquad (2)$$

Since the dynamic range is maximum by setting Vb as half of the supply voltage which is transmitted to 3INV, Vb=Vdd/2 when the supply voltages are provided by +Vdd and the grounded potential usually, and Vb=0 when the supply voltages are both positive and negative. Here, assuming that the supply voltages are +Vdd and ground, and Vb=Vdd/2, Equation (3) is derived from Equation (2):

$$Vo = -\left(\frac{C_1}{Cf}V_1 + \frac{C_2}{Cf}V_2 + \ldots \frac{C_n}{Cf}V_n\right) + \frac{C_1+C_2+\ldots C_n+Cf}{2Cf}Vdd \qquad (3)$$

Inverting amplifier 3INV outputs voltage Vo having offset voltage $((C_1+C_2+\ldots+C_n+Cf)/(2Cf))$, the value of the sum of each input voltage $V_1, V_2, \ldots V_n$ multiplied by a coefficient which is the ratio of $C_1, C_2, \ldots C_n$ and feedback capacitance Cf ($C_1/Cf, C_2/Cf, \ldots C_n/Cf$), and inverted polarity.

It is provided that input capacitances C1, C2, ... Cn are equal as in Equation (4), and Cf is the sum of all input capacitances as in Equation (5):

$$C_1=C_2=C_3=\ldots C_n \qquad (4)$$

$$Cf=NC_1 \qquad (5)$$

In this case, Equation (6) is derived from Equation (3), that is, Vo is calculated by dividing the sum of $V_1$ to $V_N$ by the input number, inverting its polarity, and adding the offset of Vdd to it:

$$Vo = -\frac{1}{N}(V_1 + V_2 + \ldots V_N) + V_{dd} \quad (6)$$

Assuming that the grounded potential and the predetermined voltage are output as 0-output and 1-output, respectively, from each of XOR gates $4_1$ to $4_N$, that input capacitances $C_{11}$ to $C_{N1}$, $C_{12}$ to $C_{N2}$, ... $C_{1M}$ to $C_{NM}$ are equal in adders $7_1$ to $7_M$, respectively, and that each feedback capacitances $C_{f1}$ to $C_{fM}$ is the sum of its corresponding input capacitances, the analog output voltage corresponding to the number of input bit 1 is output respectively from output terminals of adders $7_1$ to $7_M$, as is clear from Equation (6).

That is, the analog voltage corresponding to the number of the lowest bits ($X'_{11}$, $X'_{21}$, ... $X'_{N1}$) the value of which is 1 among the outputs of XOR-circuits $4_1$ to $4_N$ is generated from the output of adder $7_1$ (inverting amplifier $8_1$), and the analog voltage corresponding to the number of $2^1$ bits ($X'_{12}$, $X'_{22}$, ... $X'_{N2}$) the value of which is 1 in the outputs from gates $4_1$ to $4_N$ is generated from the output of adder $7_2$, similarly, in the following stage, the analog voltage corresponding to the number of bit of corresponding weight whose value is 1 the weight is output. Generally, the analog voltage corresponding to the number of $2^{M-1}$ bits ($X'_{1M}$, $X'_{2M}$, ... $X'_{NM}$) whose value is 1 in the output of $4_1$ to $4_N$ is output from adder $7_M$.

Providing that input capacitances $C_1$ to $C_M$ in adder 9 have the relationship given in Equation (7), and that feedback capacitance Cf is equal to the sum of $C_1$ to $C_M$ as in Equation (8), Equation (3) is transformed into Equation (9):

$$C_M = 2C_{M-1} = 2^2 C_{M-2} = \ldots 2^{M-2} C_2 = 2^{M-1} C_1 \quad (7)$$

$$Cf = \sum_{i=1}^{M} C_i \quad (8)$$

$$Vo = -\frac{C_1}{Cf}(V_1 + 2V_2 + 2^2 V_3 + \ldots 2^{M-1} V_M) + V_{dd} \quad (9)$$

The voltage summed after multiplying the corresponding weight to the sum of each bit generated in $7_1$ to $7_M$ is obtained from output terminal 6 of 9.

The analog addition circuit configuration is not limited to the embodiment above. If the digital data output from the XOR-circuits can be added using analog techniques, any circuit is adaptable. For example, converting the outputs of the XOR-circuits into analog signals permits their being added by an analog addition circuit.

As mentioned, the present matched filter uses the shift register as a delay circuit because the input signal is digitized. This means that a delay circuit can be easily formed. Since multiplication is executed by the XOR-circuits, the multiplication circuit can be simplified. The output voltage from each XOR-circuit can be added in analog adder 5 with low power consumption and high accuracy. Especially when the output bit number M from A/D converter 2 decreases, a very small-size circuit can be realized.

Although any structure can be employed in A/D converter 2, one with low power consumption is described with reference to FIG. 4. For simplification, the output bit number M is 2 in FIG. 4.

Figure 4:
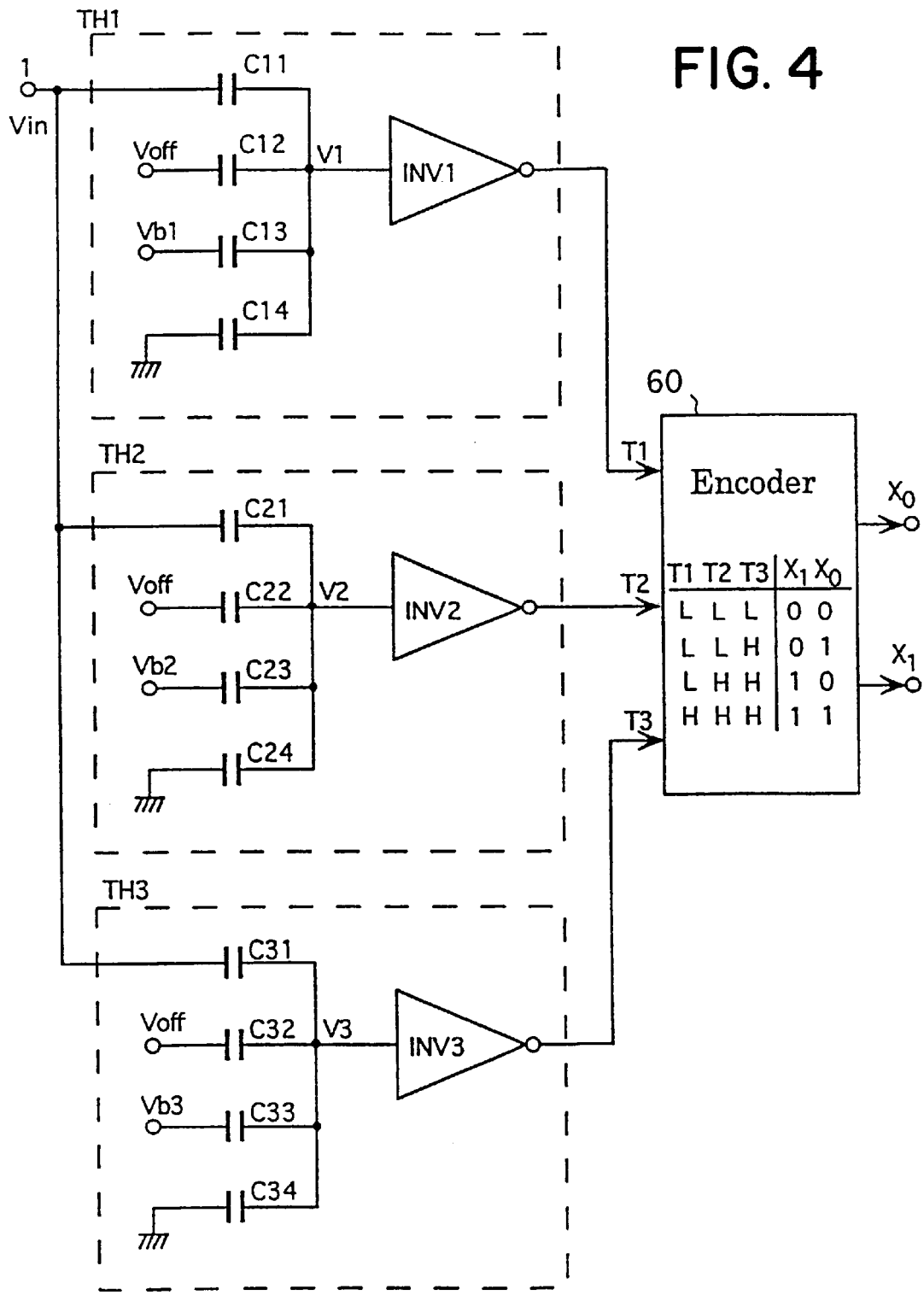
FIG. 4 shows an exemplary configuration of an analog-to-digital converter in the matched filter used in the first embodiment.
Figure 5:
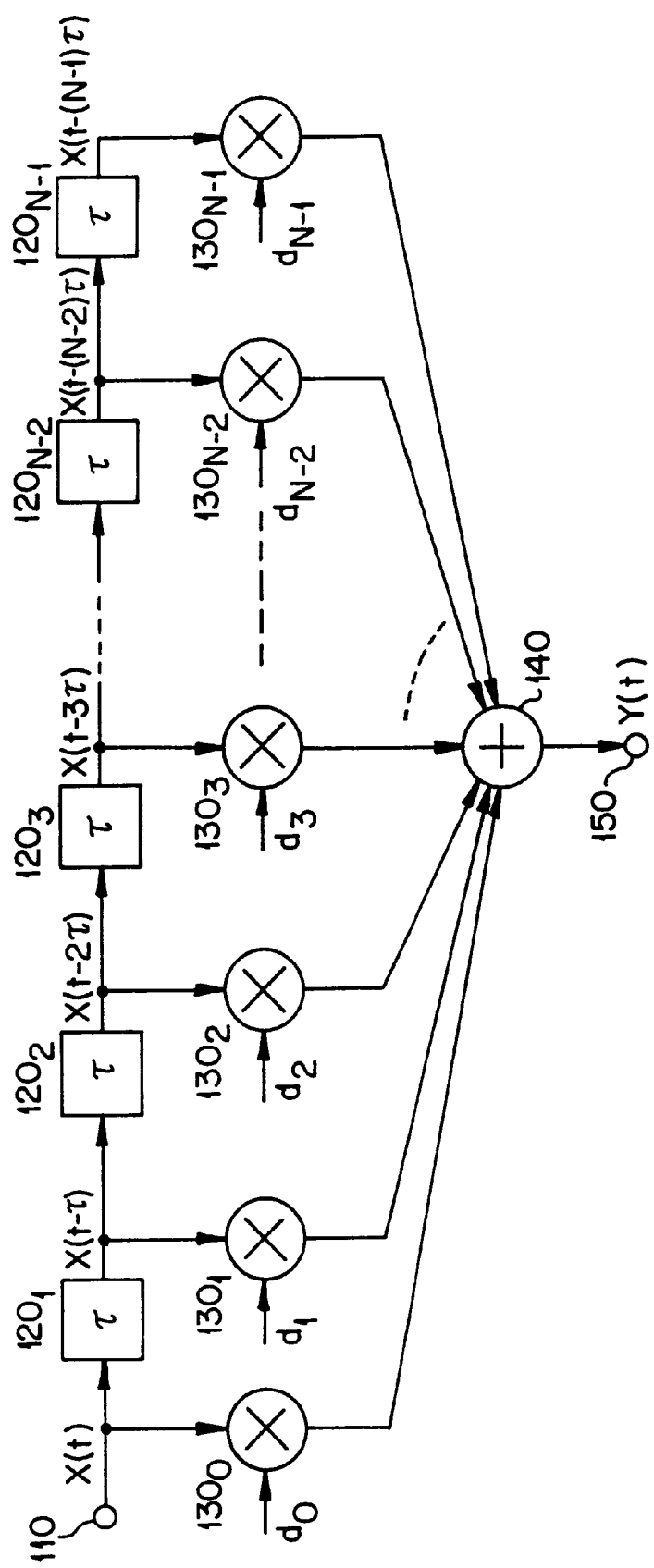
FIG. 5 serves to explain the conventional matched filter structure.

In FIG. 4, TH1 to TH3 are threshold circuits which have identical structures. As shown, they include inverting amplifiers INV1 to INV3 which are implemented using CMOS inverters, for example, and four input capacitances are connected to each amplifier INV1 to INV3. The outputs of INV1 to INV3 are input to encoder 60.

Reference numeral 1 denotes an input terminal for receiving signals as an input voltage Vin. This terminal 1 is connected to the first input capacitances C11, C21 and C31 of TH1, TH2 and TH3, respectively. Offset voltage Voff is input to the second input capacitances C12, C22 and C32, and bias voltage Vb is input to the third input capacitances C13, C23 and C33. The fourth input capacitances C14, C24 and C34 are connected to ground.

In this structure, the output voltage of the capacitive coupling at the input of TH1, that is, the voltage input to INV1, is V1, and Equation (10) is true from the law of conservation of energy:

$$C11(Vin-V1) + C12(Voff-V1) + C13(Vb1-V1) + C14(0-V1) = 0 \quad (10)$$

Consequently, V1 is calculated by Equation (11):

$$V1 = \frac{C11Vin + C12Voff + C13Vb1}{C11 + C12 + C13 + C14} \quad (11)$$

When V1 is greater than or equal to threshold voltage Vth of INV1 (usually, it is Vdd/2), the output of INV1 is low-level, which is expressed in Equation (12):

$$\frac{C11Vin + C12Voff + C13Vb1}{C11 + C212 + C13 + C14} \geq Vth \quad (12)$$

Therefore, when input voltage Vin at input terminal 1 satisfies Equation (13), the output of INV1 is low-level:

$$Vin \geq \frac{C11 + C12 + C13 + C14}{C11} Vth - \frac{C12Voff + C13Vb1}{C11} \quad (13)$$

The threshold voltage of TH1 is set by controlling C13. The values of C12 and Voff are designed so that their product cancels the offset of INV1.

The threshold voltages of TH2 and TH3 can be set similarly.

With the threshold voltages of TH1, TH2 and TH3 being −v, 0 and v, respectively, when the input voltage is lower than −v, all outputs of TH1, TH2 and TH3 stay high-level; when it is between −v to 0, the output of TH1 is low and those of TH2 and TH3 are high; when it is between 0 to v, the outputs of TH1 and TH2 are low and that of TH3 is high; and when it is higher than v, all the outputs of TH1 to TH3 are low. A 2-bit digital output can be output corresponding to each stage by inputting the outputs of TH1 to TH3 to encoder 60.

This structure makes possible an analog-to-digital converter with very low electric power consumption.

The three threshold circuits in FIG. 4 convert analog data into 2-bit digital data; to convert digital data with more bits, more threshold circuits can be configured in the converter.

As in the explanation above, the present invention provides a matched filter using a small circuit which has low power consumption. Its analog-to-digital converter including a capacitive coupling and an inverter further decreases electric power consumption.

Figure 6:
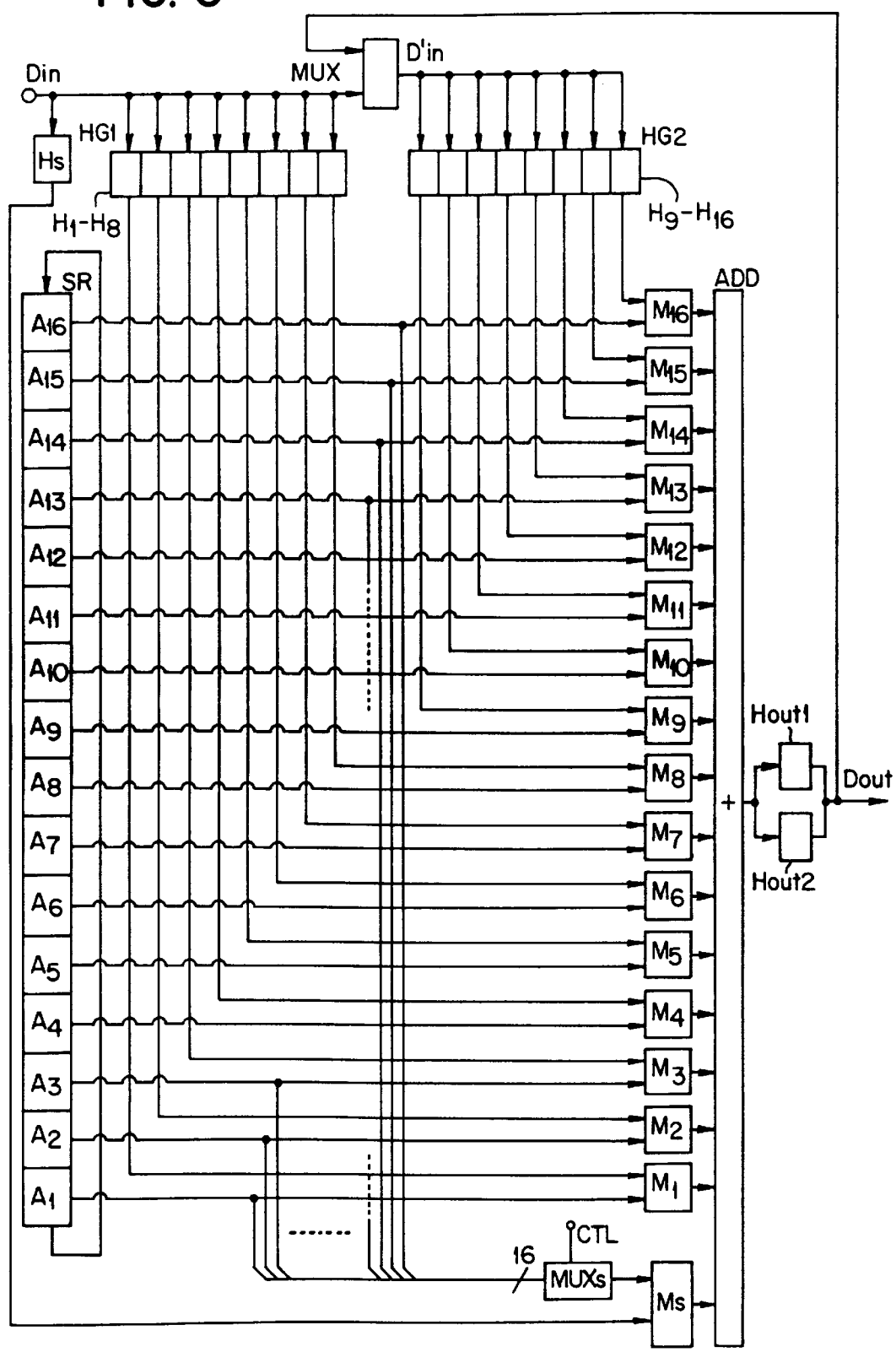
FIG. 6 shows a block diagram of the overall filter circuit according to a second preferred embodiment of the present invention.

FIG. 6 shows the overall structure of a filter circuit according to a second preferred embodiment of the present invention. To simplify the description, the parts are designated exactly as in FIG. 15. In FIG. 6, Hs is an auxiliary sample-and-hold circuit connected to input terminal Din, MUXs shows a multiplexer circuit receiving the outputs from stages $A_1$ to $A_{16}$ of shift register SR to select and output one of them according to controlling signal CTL, Ms is an auxiliary multiplication circuit for multiplying the output of Hs and the coefficient output from MUXs. ADD shows an adder for receiving outputs from $M_1$ to $M_{16}$ and Ms, in which two addition circuits are set, as described later. Hout1 and Hout2 are holding circuits with identical configurations connected in parallel to the output of ADD. Their outputs are connected to Dout as well as to one input of multiplexer MUX. All other parts are the same as those in FIG. 15.

Figure 15:
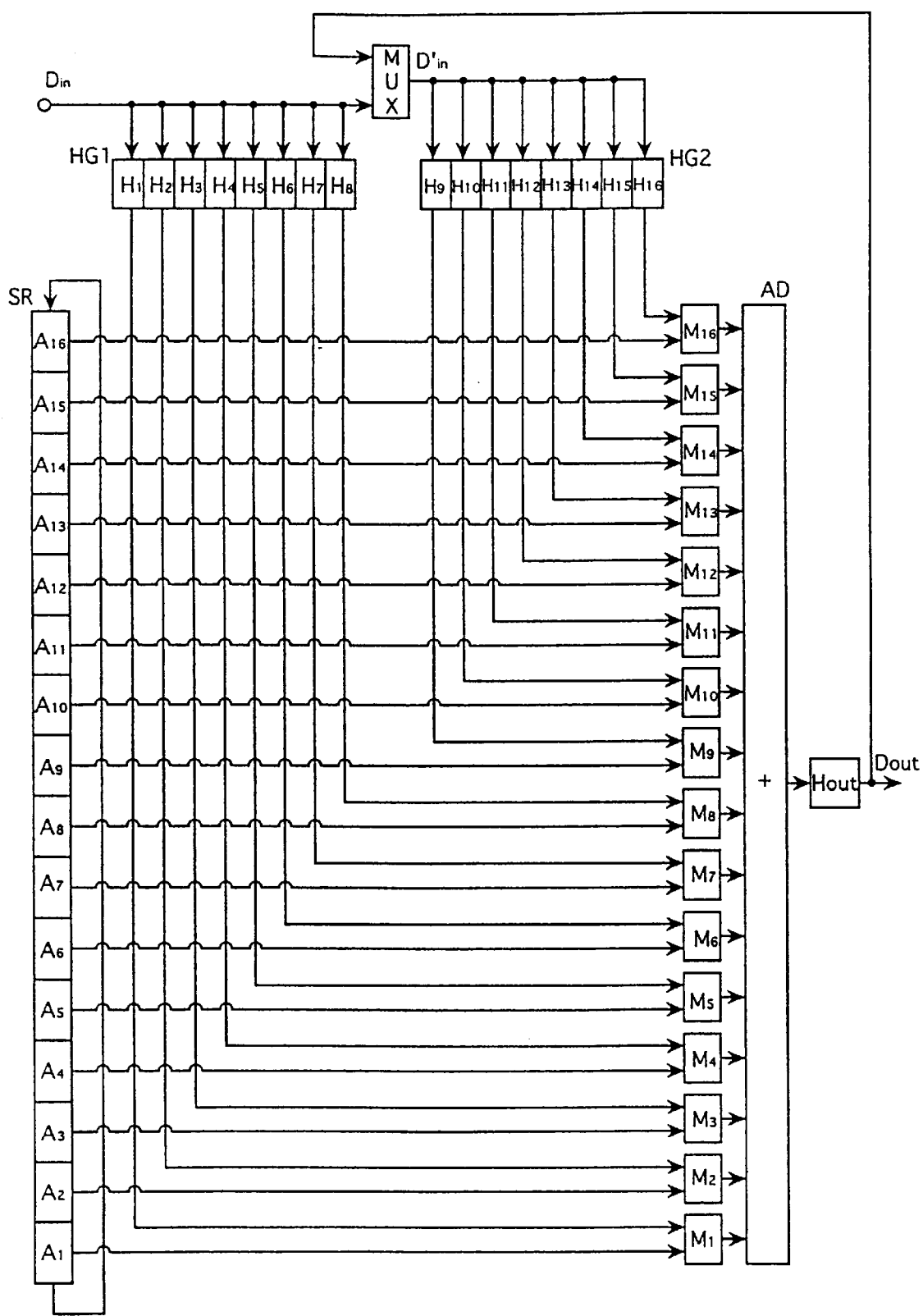
FIG. 15 shows a block diagram of a conventional filter circuit.
Figure 17A:
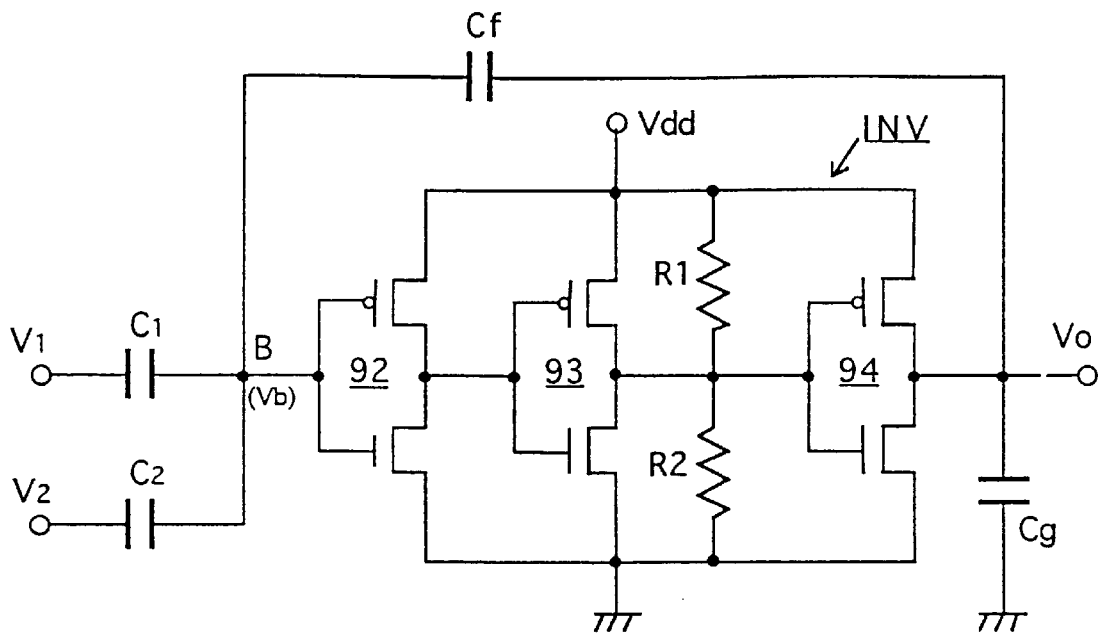
FIGS. 17(a) and 17(b) show neural operation circuits according to related art.
Figure 17B:
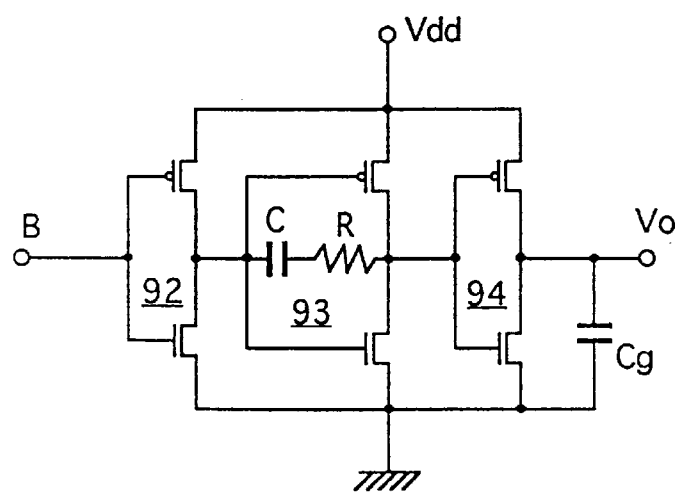

The present filter circuit differs from the conventional one in FIG. 15 in that it has a sample-and-hold circuit (Hs) and a multiplication circuit (Ms), two addition circuits in an adder (ADD), and double holding circuits (Hout1 and Hout2).

In this filter circuit, H1 to H16, Hs, Hout1 and Hout2, $M_1$ to $M_{16}$ and Ms, and the two addition circuits in ADD can all be refreshed.

Figure 7:
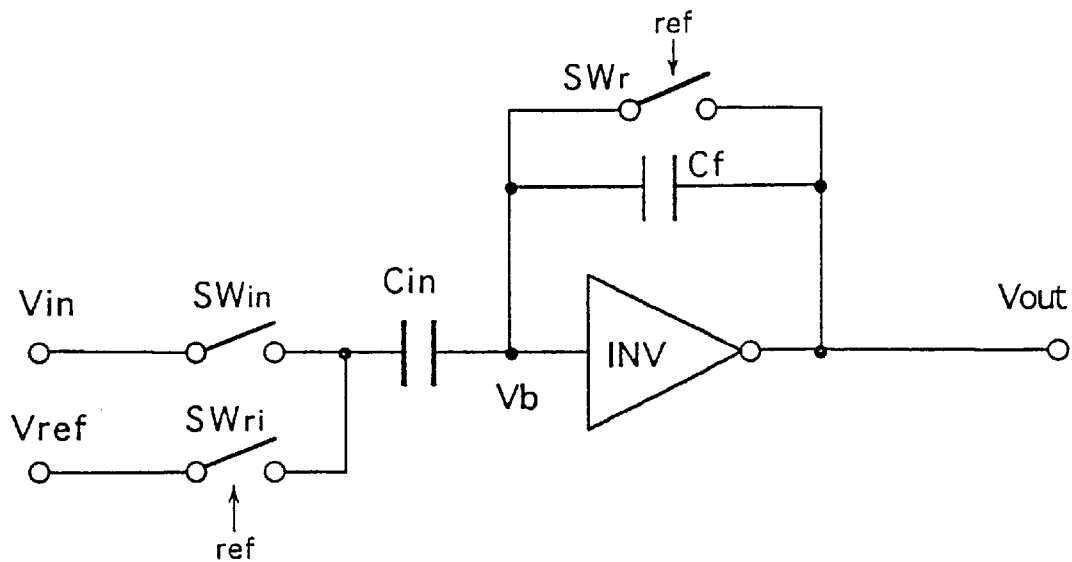
FIG. 7 shows an exemplary sample-and-hold circuit usable in the second embodiment.

Hs and $H_1$ to $H_{16}$ have the same structure, and an example is shown in FIG. 7. FIG. 7 uses the same parts as those in FIG. 18 and their description is omitted. In FIG. 7, switch SWri is set to input the reference voltage Vref (=Vb) to input capacitor Cin, and switch SWr is set for short-circuiting feedback capacitor Cf. SWri and SWr have their conductivity governed by control signal ref; for example, they are conductive when signal ref is high-level.

Figure 18:
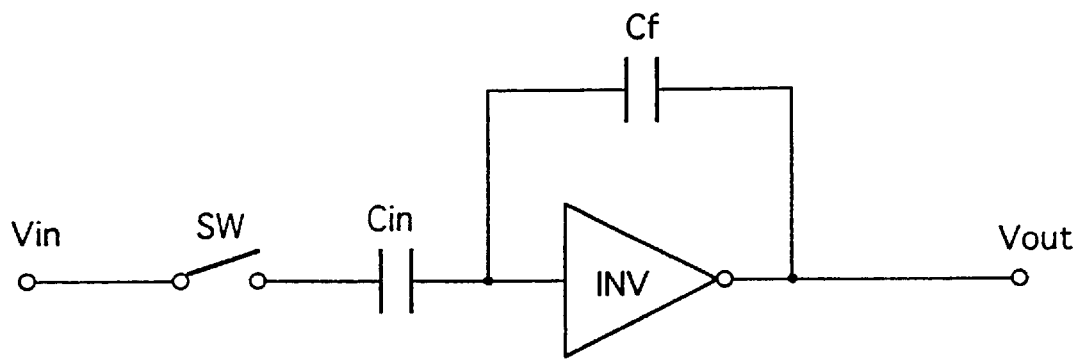
FIG. 18 shows a sample-and-hold circuit of a conventional filter circuit.

Such a sample-and-hold circuit performs the same function as that in FIG. 18 in the normal mode where ref is low-level and SWri and SWr are open.

During refreshing, ref is high-level, both SWri and SWr are closed, the reference voltage Vref is given to the input of Cin, and so feedback capacitor Cf is short-circuited. This cancels the residual charge stored in Cin and Cf; simultaneously, the reference voltage Vb (=Vref) is output from inverting amplifier INV.

Figure 8:
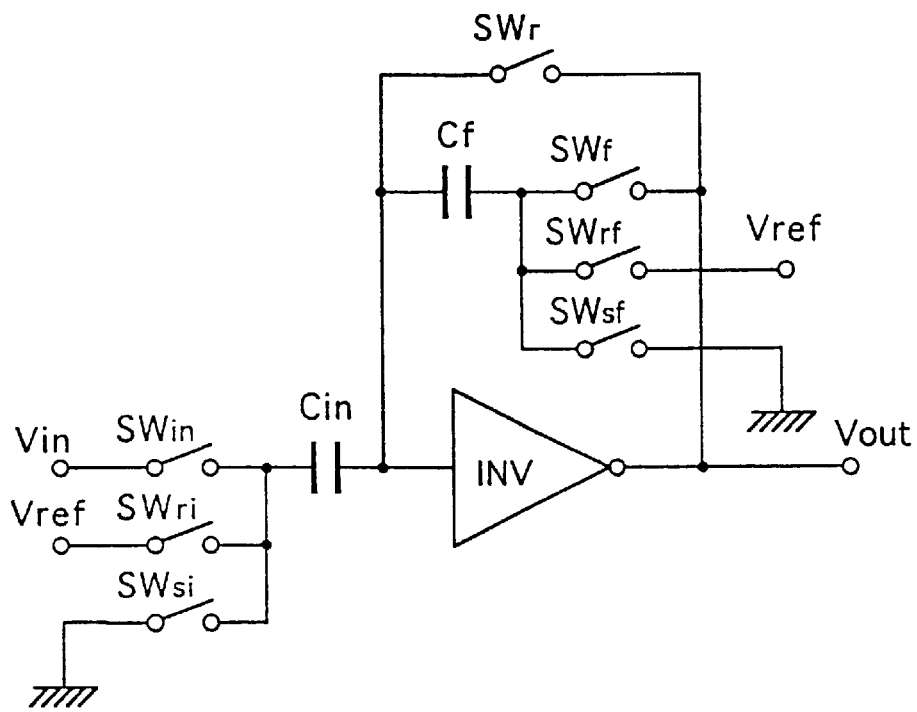
FIG. 8 shows another exemplary sample-and-hold circuit usable in the second embodiment.

FIG. 8 shows another configuration where Hs and $H_1$ to $H_{16}$ are able to be refreshed. The sample-and-hold circuit in FIG. 8 is not only refreshable but also capable of sleep mode operation, in which power consumption is very low.

As in FIG. 8, switch SWsi in this sample-and-hold circuit is set at the input of Cin to control the connection between Cin and the ground in addition to SWin and SWri. At the output terminal of INV, switches SWf, SWrf and SWsf are provided to control the connection between the output of INV and the output terminal of Cf, that between the output terminal of Cf and Vref, and that between the output terminal of Cf and the ground, respectively. SWr is set between the output and input terminals of INV, as in FIG. 7, and it is opened and closed in conjunction with SWri and SWrf. SWri and SWsi, and SWrf and SWsf are closed selectively.

This sample-and-hold circuit works like the one in FIG. 18 in the normal mode where SWin and SWf are conductive, and SWri, SWsi, SWr, SWrf and SWsf are nonconductive.

When SWin, SWf, SWsi and SWsf are opened and SWri and SWrf are closed, the residual charges in Cin and Cf are canceled and refreshed by transmitting Vref through the input of Cin and the output of Cf to short-circuit the input and output of INV. Then, the output of INV is Vb (=Vref).

Moreover, when Swin, Swf, Swri, SWr and SWrf are opened and Swsi and SWsf are closed, this circuit is in a sleep mode. In this case, INV works under saturation without its Df connection and with its input connected to ground. Power consumption in each CMOS inverter is sufficiently low that it can be ignored. Swsi can be connected to supply voltage Vdd instead of ground to attain the sleep mode with lower power consumption.

Figure 9:
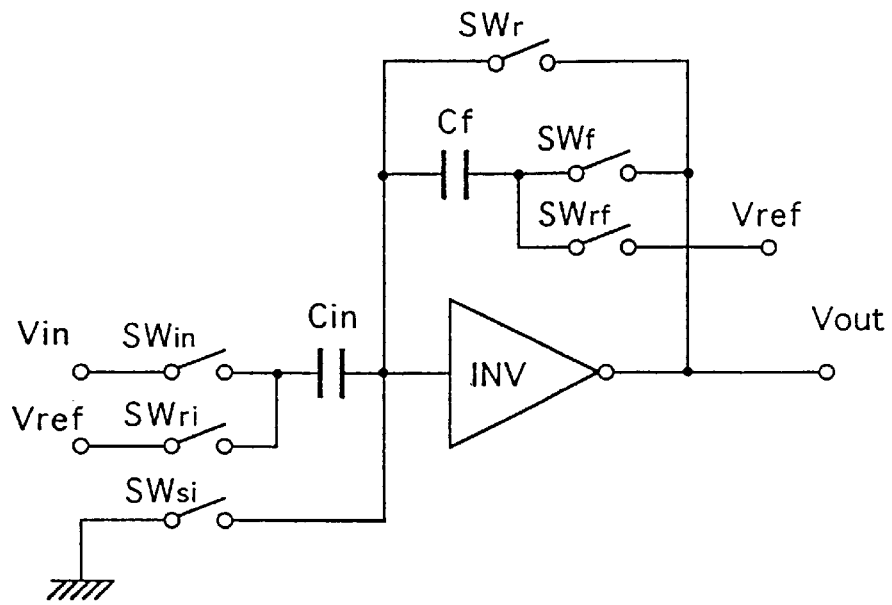
FIG. 9 shows an exemplary sample-and-hold circuit other than those in FIGS. 7 and 8.

FIG. 9 shows one further example of Hs and $H_1$ to $H_{16}$. This embodiment derives from and simplifies FIG. 8 by moving SWsi for the sleep mode directly to the input of INV from its previous location between the input of Cin and the ground, as well as eliminating SWsf for sleep mode setting at the output of Cf.

This sample-and-hold circuit functions like the one in FIG. 8 for normal work and refreshing. In sleep mode, SWsi is conductive, and the input of INV is grounded; consequently, INV is saturated and its power consumption is low enough to be ignored. This circuit simplifies the one in FIG. 8 by connecting SWsi to the supply voltage.

According to the present invention, sample-and-hold circuits $H_1$ to $H_{16}$ and Hs have refreshing means. Therefore, it is feasible to refresh $H_1$ to $H_{16}$ one after another in a predetermined cycle, and the function of refreshing these sample-and-hold circuits can be replaced by Hs. Hs can be refreshed while no circuit among $H_1$ to $H_{16}$ is being refreshed.

Holding circuits Hout1 and Hout2 in FIG. 6 have structures similar to each sampling and holding circuit above, and are able to be refreshed by each control signal. These can also be refreshed alternately.

Figure 10:
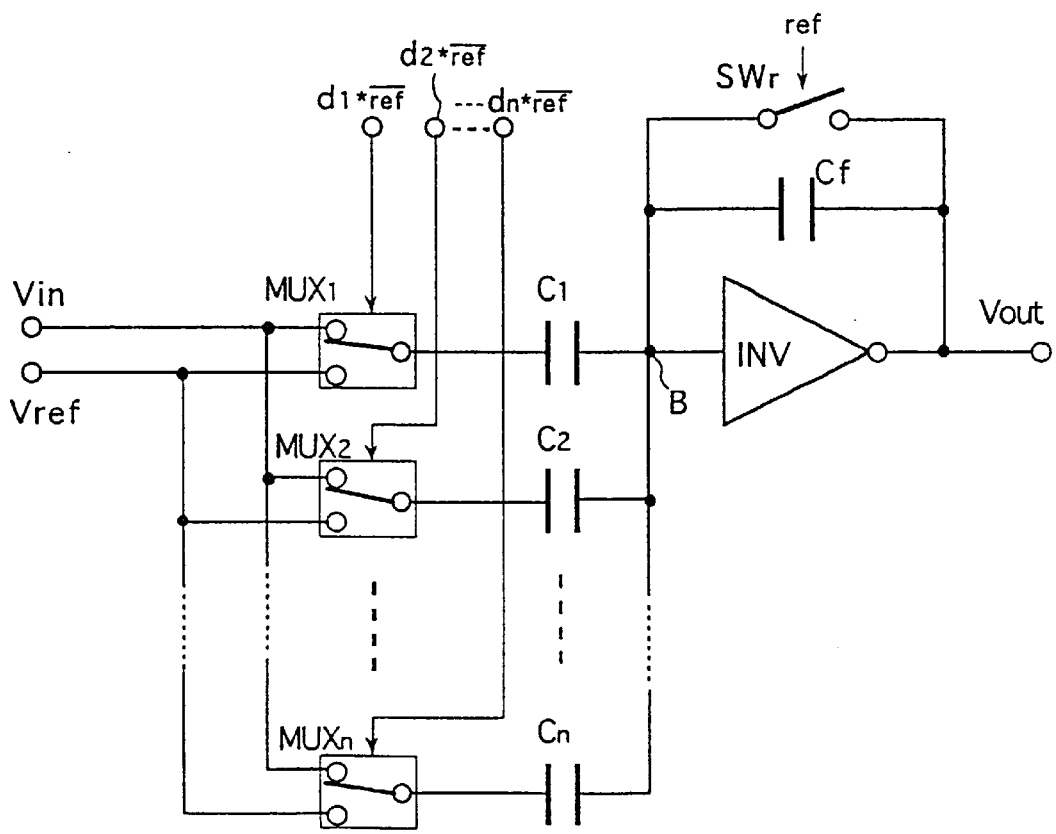
FIG. 10 shows an exemplary multiplication circuit usable in the second embodiment.
Figure 19:
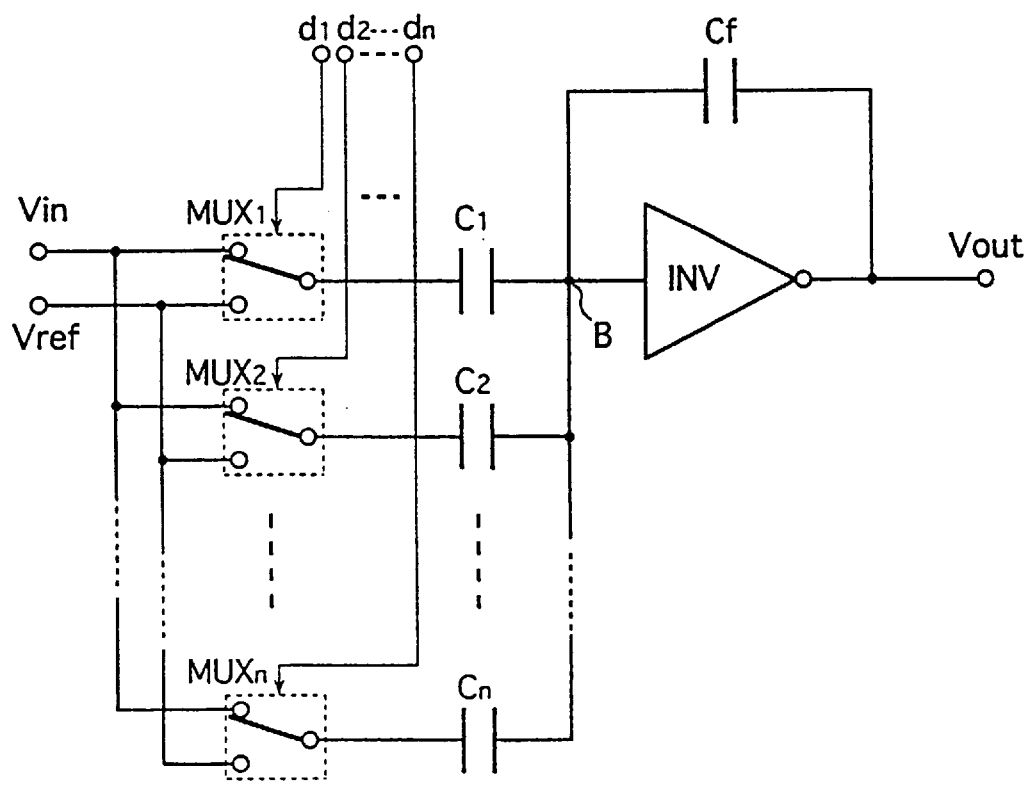
FIG. 19 shows a multiplication circuit of the conventional filter circuit.

FIG. 10 shows a configuration of multiplication circuits $M_1$ to $M_{16}$ and Ms. FIG. 10 uses the same parts as those in FIG. 19, and their detailed description is omitted. As shown, switch SWr is set for short-circuiting feedback capacitor Cf, and control signal ref is supplied to SWr as above. Control signals supplied to capacitor-switching multiplexers $MUX_1$ to $MUX_n$ are from (reversed ref) $d_1^*$ to $d_n^*$. "*" shows an AND operation. When ref is low level (normal work), SWr is opened, and $MUX_1$ to $MUX_n$ are controlled by its opening and closing according to $d_1$ to $d_n$. In this case, the multiplications of n-bit digital coefficients and input analog voltages are performed like those of the multiplication circuit in FIG. 19.

When ref is high-level, SWr is closed and $MUX_1$ to $MUX_n$ are switched to select the reference potential Vref. Cf is short-circuited to cancel its residual charge, and, simultaneously, the residual charges of $C_1$ to $C_n$ are also canceled, and so Vref=Vdd/2=Vb is output from output terminal Vout.

Although FIG. 10 shows a configuration with refreshing means similar to that in FIG. 7, setting a switch to connect to ground or the supply voltage creates an embodiment with a sleep mode as in FIGS. 8 and 9.

As described, $M_1$ to $M_{16}$ have refresh-capable configurations. They can be refreshed one after another by replacing one of $M_1$ to $M_{16}$ with Ms, which also can be refreshed after $M_1$ to $M_{16}$ have been refreshed once.

Figure 11A:
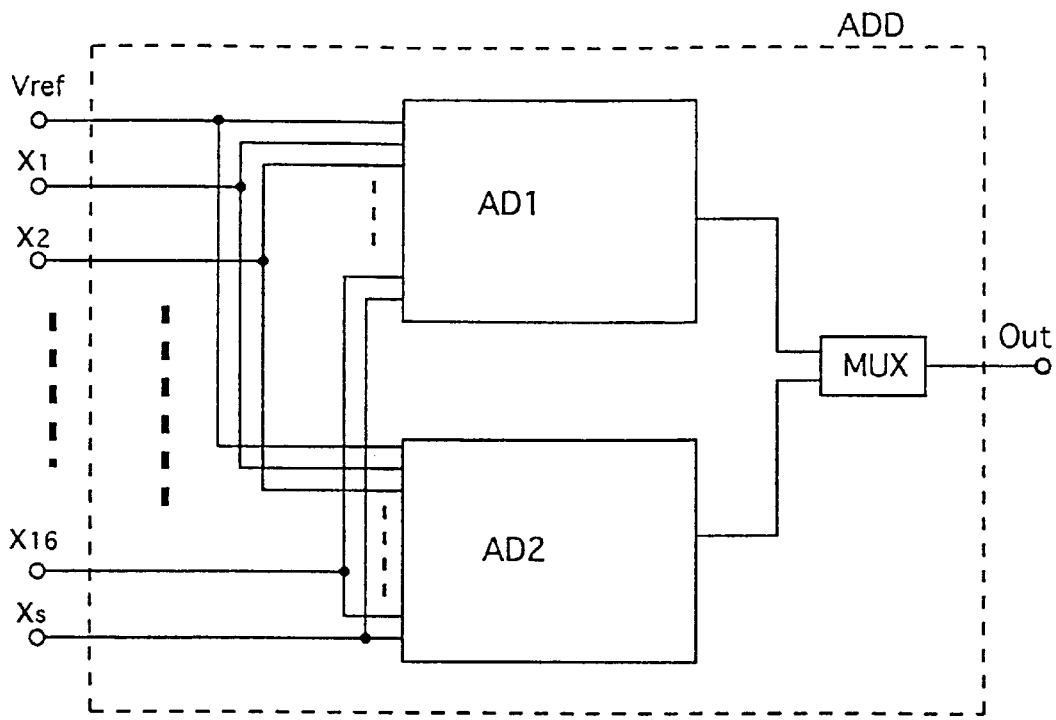
FIGS. 11(a) and 11(b) show adders usable in the second embodiment.

FIG. 11(a) shows an embodiment of adder ADD. In FIG. 11(a), $X_1$ to $X_{16}$ are input terminals for receiving the outputs of $M_1$ to $M_{16}$, Xs is an input terminal for receiving the output of Ms, AD1 and AD2 are addition circuits with the same configurations, MUX is a multiplexer for selectively producing the output of AD1 or AD2 at output terminal Out. In this structure, input signals from $X_1$ to $X_{16}$ and Xs are selectively input to the first addition circuit AD1 or the second addition circuit AD2, and their outputs are generated at Out through controlling MUX.

By alternately using AD1 and AD2, the one receiving no input signal can be refreshed.

Figure 11B:
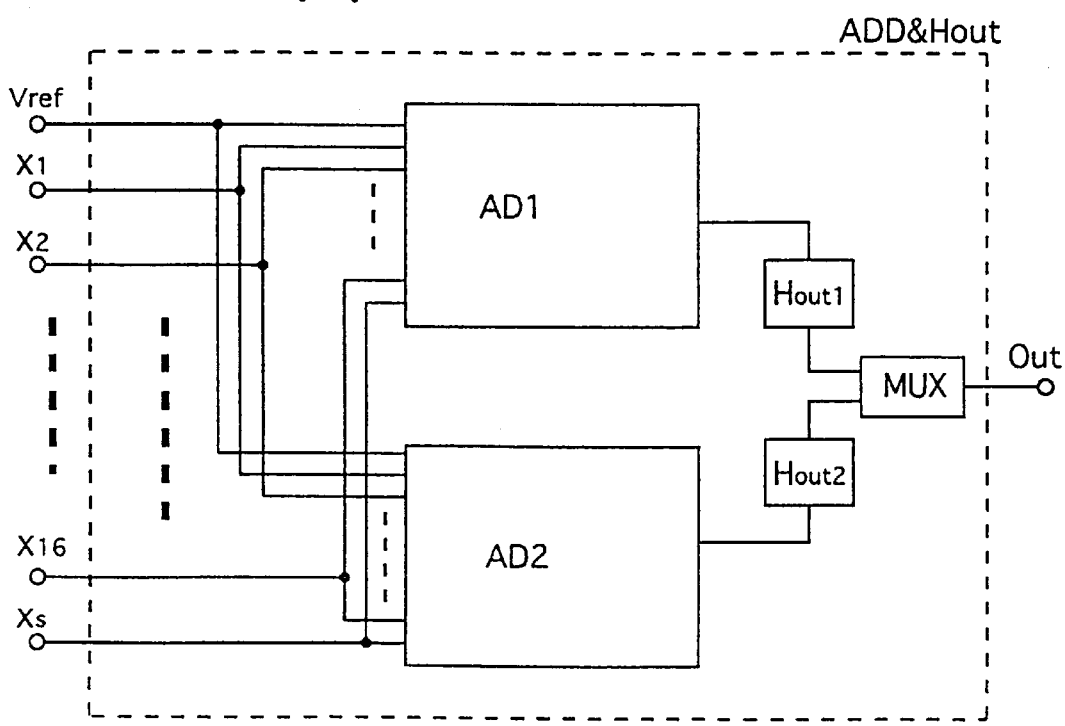

FIG. 11(b) shows an embodiment in which ADD, Hout1 and Hout2 are put together. Hout1 and Hout2 are directly connected to AD1 and AD2, respectively, to transmit each output of Hout1 and Hout2 to MUX. Alternately, using the pairs of AD1 and Hout1 and AD2 and Hout2 means the addition circuit and holding circuit of the pair not in use can be refreshed.

Figure 12:
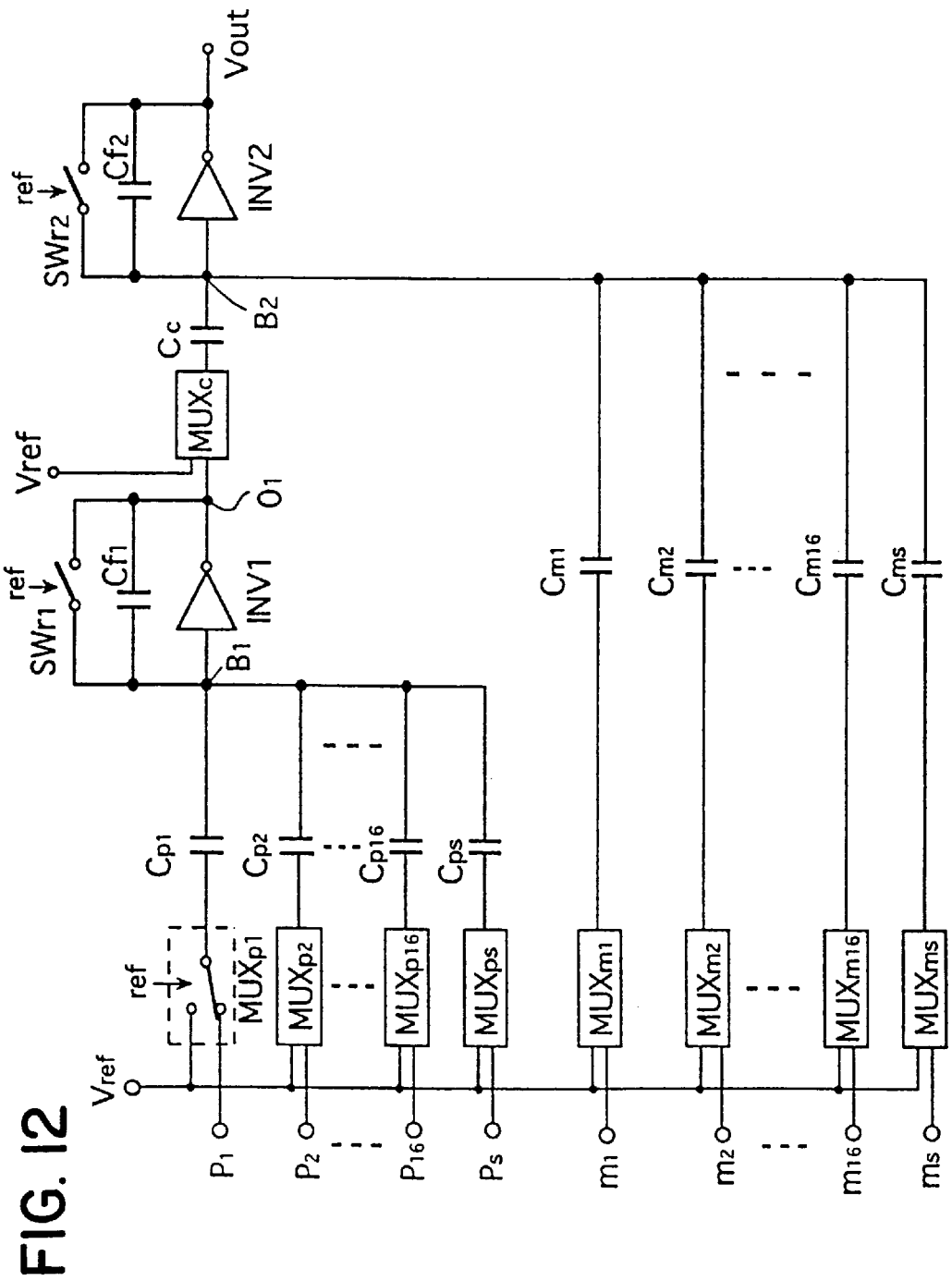
FIG. 12 shows an exemplary addition circuit usable in the second embodiment.
Figure 20:
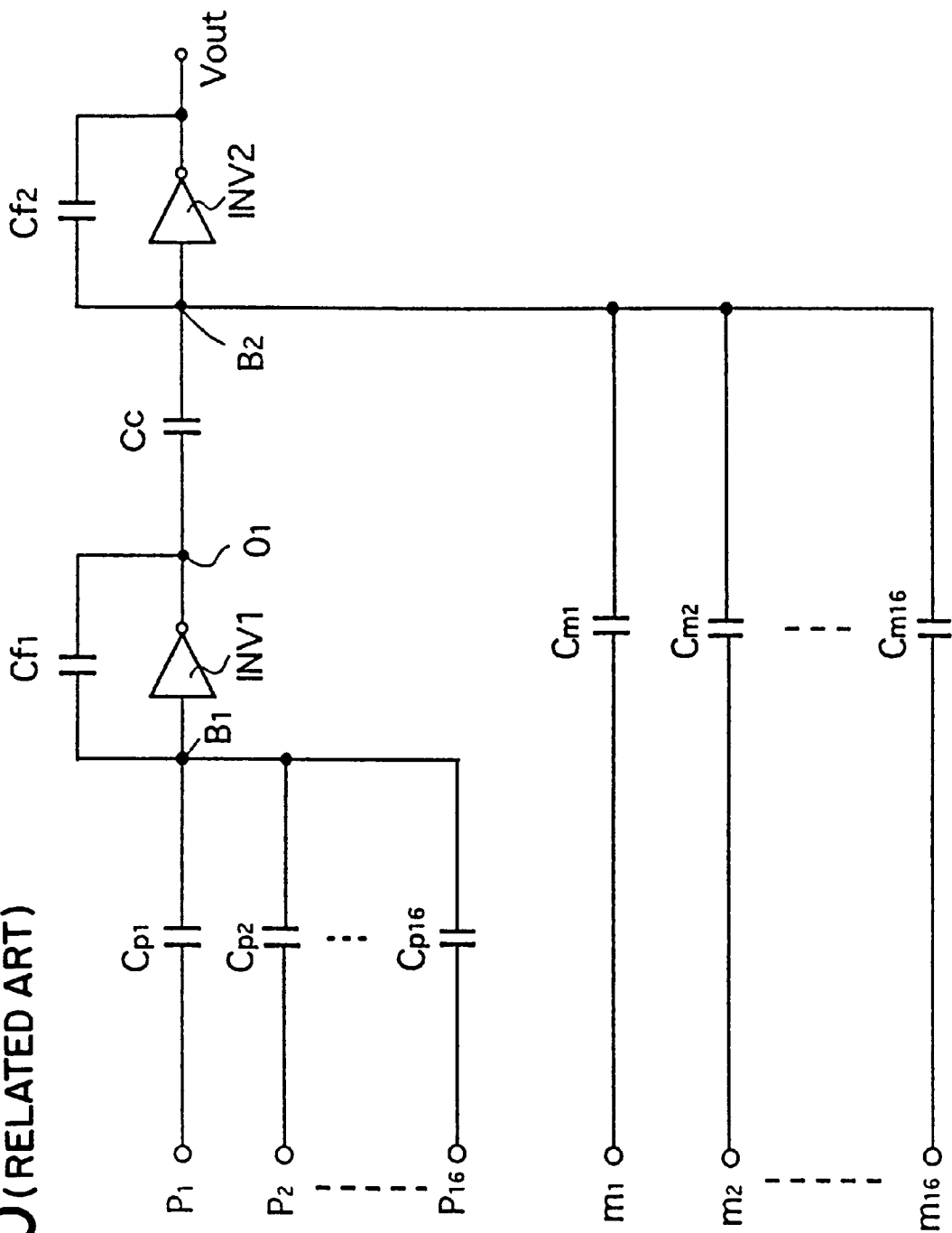
FIG. 20 shows an addition circuit of the conventional filter circuit.

FIG. 12 shows the similarly-structured AD1 and AD2, which have the same configuration as the circuit in FIG. 20 with refreshing means added. FIG. 12 uses the same parts as those in FIG. 20, and their description is omitted. $MUX_{p1}$ to $MUX_{p16}$ are multiplexers supplied at the inputs of $C_{p1}$ to $C_{p16}$, which alternatively select input voltage $V_{p1}$ to $V_{p16}$ from $p_1$ to $p_{16}$, respectively, and reference potential Vref, according to control signal ref. $MUX_{m1}$ to $MUX_{m16}$ are multiplexers supplied at the inputs of input capacitors $C_{m1}$ to $C_{m16}$, which alternatively select, according to control signal ref, input voltage $V_{m1}$ to $V_{m16}$ from $m_1$ to $m_{16}$, respectively, and reference potential Vref.

Input terminals $p_s$ and $m_s$ are provided corresponding to multiplication circuit Ms, and these are used to input the output signal from Ms as it replaces the function of whichever one of multiplication circuits $M_1$ to $M_{16}$ is being refreshed. $MUX_{ps}$ and $MUX_{ms}$ are multiplexers set corresponding to input terminals $p_s$ and $m_s$, and $C_{ps}$ and $C_{ms}$ are input capacitors connected to multiplexers $MUX_{ps}$ and $MUX_{ms}$. $MUX_{ps}$ and $MUX_{ms}$ alternatively select the reference potential and input voltage from $p_s$ and $m_s$ corresponding to ref, respectively, similar to $MUX_{p1}$ to $MUX_{p16}$ and $MUX_{m1}$ to $MUX_{m16}$.

Switches SWr1 and SWr2 are connected in parallel to feedback capacitors $Cf_1$ and $Cf_2$ of the first and second inverting amplifiers INV1 and INV2, respectively. SWr1 and SWr2 are conductive by ref.

Multiplexer MUXc is connected between $O_1$ of the output of INV1 and capacitive coupling Cc, which selectively inputs Vref or the output of INV1 to Cc. MUXc is configured to select Vref and the output of INV1 according to ref, like $MUX_{p1}$ to $MUX_{ms}$.

Addition circuits AD1 and AD2 with this configuration work in the same manner as the addition circuit in FIG. 20 to obtain the output voltage by subtracting the sum of input voltage $V_{m1}$ to $V_{ms}$ from input terminals $m_1$ to $m_s$ from the sum of $V_{p1}$ to $V_{ps}$ input from $p_1$ to $p_s$. The condition is that ref is low-level, $MUX_{p1}$ to $MUX_{ps}$ and $MUX_{m1}$ to $MUX_{ms}$ are controlled to select corresponding input terminals $p_1$ to $p_s$ and $m_1$ to $m_s$, MUXc is controlled to select INV1 output, and $SW_{r1}$ and $SW_{r2}$ are open, which is the normal mode.

When Vref is high, AD1 and AD2 are refreshed in the same way in the sample-and-hold circuits and the multiplication circuits above by managing all multiplexers $MUX_{p1}$ to $MUX_{ps}$, $MUX_{m1}$ to $MUX_{ms}$ and MUXc to select Vref, so that $SW_{r1}$ and $SW_{r2}$ are short-circuited.

Figure 13:
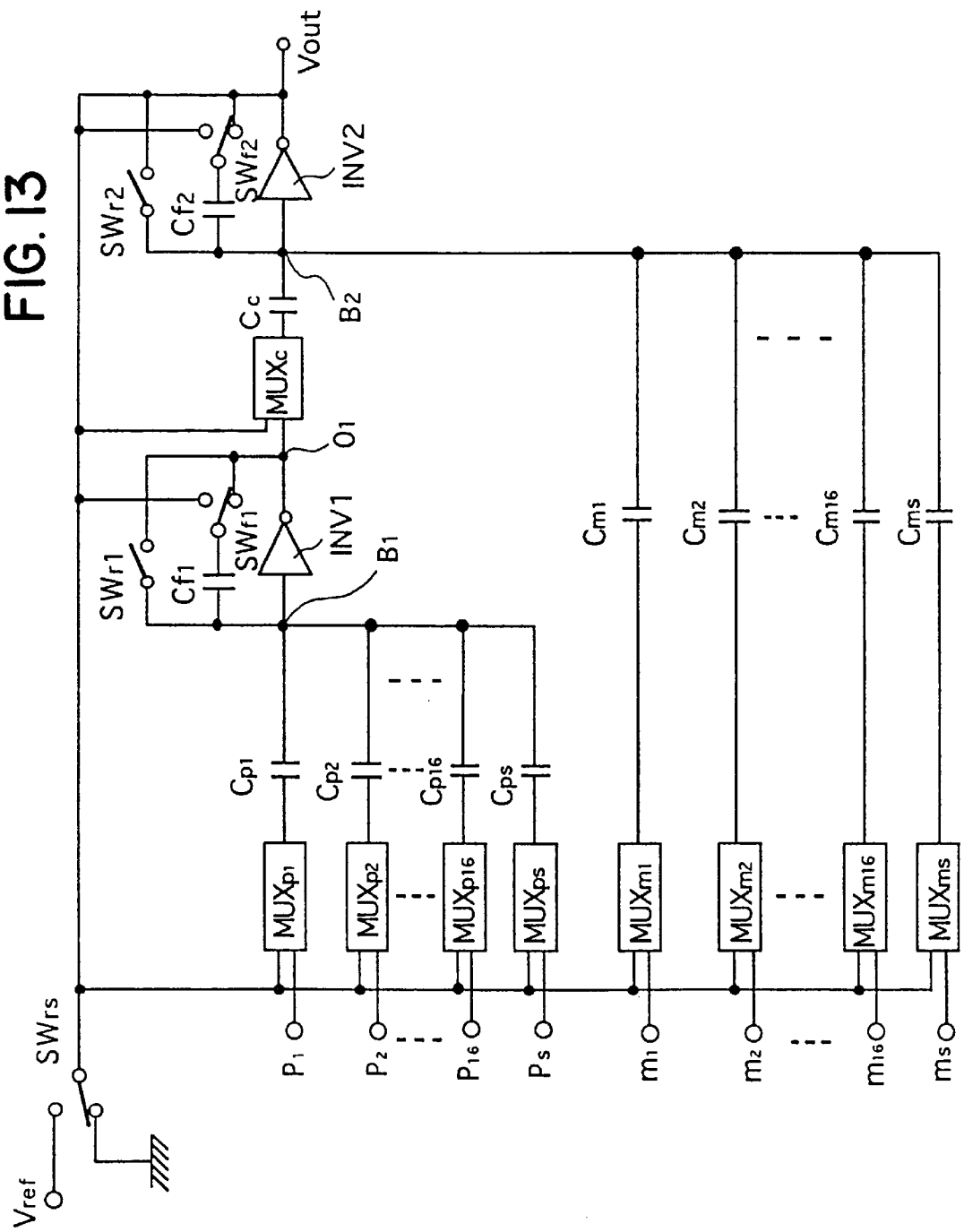
FIG. 13 shows another exemplary addition circuit usable in the second embodiment.

FIG. 13 shows the embodiment of the addition circuit with refreshing means: it has a circuit for sleep mode structured like that of the sample-and-hold circuit in FIG. 8. As shown, this circuit has switch SWrs for selectively supplying Vref or the grounded voltage to $MUX_{p1}$ to $MUX_{ms}$ and MUXc, switch SWf1 for selectively connecting the output of feedback capacitor $Cf_1$ to the output of INV1, and switch SWrs for selectively connecting the output of feedback capacitor $Cf_2$ to the output of INV2, in addition to the components of the circuit in FIG. 12.

This addition circuit works in the same manner as that in FIG. 20 in the normal mode where SWf1 and SWf2 are connected to INV1 and INV2, respectively, $SW_{r1}$ and $SW_{r2}$ are opened, $MUX_{p1}$ to $MUX_{ps}$ and $MUX_{m1}$ to $MUX_{ms}$ are directed to select corresponding $p_1$ to $p_s$ and $m_1$ to $m_s$, and MUXc is managed to select the output of INV1.

When SWrs is connected to select Vref, SWr1 and SWr2 are conductive, SWf1 and SWf2 are connected to SWrs, and MUXp1 to MUXms and MUXc are controlled to select SWrs, Vref is supplied to the input of $C_{p1}$ to $C_{ms}$, the input of Cc, and the outputs of $Cf_1$ and $Cf_2$, and both the outputs and inputs of INV1 and INV2 are short-circuited thereby effecting a canceling of the residual charge and refreshing.

When SWrs is grounded, SWr1 and SWr2 are opened, SWf1 and SWf2 are connected to SWrs, and $MUX_{p1}$ to $MUX_{ms}$ and MUXc are controlled to select SWrs, the inputs of Cp1 to Cms and Cc, and the outputs of $Cf_1$ and $Cf_2$ receive the ground potential, resulting in the saturation of inverters INV1 and INV2, to which are supplied the grounded voltage. This is the sleep mode whose power consumption is low enough to be ignored. SWrs, moreover, can be connected to the supply voltage instead of the grounded potential.

As shown in FIG. 13, the structure is simplified by connecting this circuit to Vref and the grounded potential through the common switch SWrs. It can be refreshed and put in the sleep mode with the same connection in FIG. 9. Also, AD1 and AD2 are refreshable.

As in the above description, sample-and-hold circuit H1 to H16 and Hs, holding circuits Hout1 and Hout2, multiplication circuit M1 to M16 and Ms, addition circuits AD1 and AD2 in adder ADD can all be refreshed in the present filter circuit. That is, the circuit differs from the conventional one in FIG. 15, in that sample-and-hold circuit Hs and multiplication circuit Ms are provided, adder ADD includes double addition circuits AD1 and AD2, and holding circuits are set double as Hout1 and Hout2, which enables refreshing of each sample-and-hold circuit, each multiplication circuit, the addition circuit and holding circuit. There is no sacrifice of operating speed because operations continue using Hs and Ms while the sample-and-hold circuit and multiplication circuit are refreshed. The necessary hardware increases minimally and power consumption increases even less, because only one sample-and-hold circuit Hs and one multiplication circuit Ms are necessary for multiple (here, 16) of sample-and-hold circuits $H_1$ to $H_{16}$ and of multiplication circuits $M_1$ to $M_{16}$, respectively.

Figure 14:
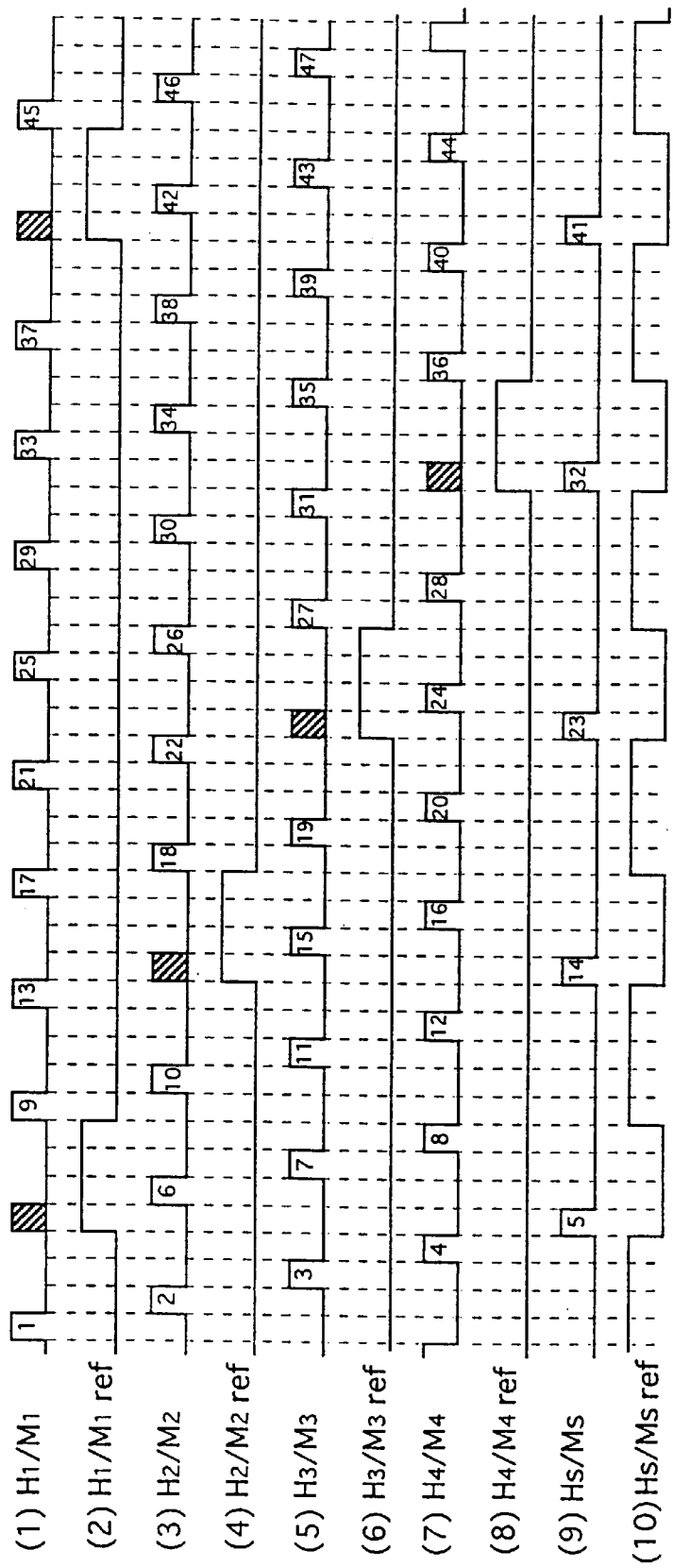
FIG. 14 shows a timing chart of the function of the filter circuit in the second embodiment.

FIG. 14 shows the refreshing timing chart for this filter circuit. To simplify the description, a four-stages filter circuit is adopted here. That is, this filter circuit includes four sample-and-hold circuits of $H_1$ to $H_4$ and another, Ms, for refreshing, and four multiplication circuits $M_1$ to $M_4$, with another, Ms, for refreshing.

In FIG. 14, (1), (3), (5) and (7) show the action timings of $H_1$ to $H_4$, and (9) shows that of Ms: the high states show the sampling periods and low states show the holding periods. A sampling period with diagonal lines shows the state when Hs is replacing the functions of one circuit among $H_1$ to $H_4$ being refreshed. That is, sampling clocks are provided to Hs during this period to Hs so that input signals are sampled.

The remaining (2), (4), (6), (8) and (10) show the refreshing timings of $H_1$ to $H_4$ and Hs: the high state shows the refresh-capable periods, and the low state shows the refresh-incapable periods. That is, data is not stored in the sample-and-hold circuit during the high state, therefore, the sample-and-hold circuit can be refreshed during this period.

In FIG. 14, sample-and-hold circuit $H_1$ is driven at sampling timing 1 to sample and hold input signals. Likewise, $H_2$, $H_3$, and $H_4$ are driven at the sampling timings 2, 3, and 4 to sample and hold the corresponding input signals. At sampling timing 5, sample-and-hold circuit Hs is driven to sample and hold its input signals. This is originally the timing $H_1$ is driven at.

Since $H_1$ does not sample input data after timing 5 has passed and before timing 9 starts, it can be refreshed during this period. A circuit control (not shown) provides the control signal for refreshing—in FIG. 7, for example, ref closes switches SWri and SWr—and refreshing is carried out.

At sampling timing 5, control signal CTL is provided to multiplexer MUXs (FIG. 6) to select the outputs of stage $A_1$ which stores the multiplication coefficients corresponding to sample-and-hold circuit $H_1$ in cyclic shift register SR, and multiplication circuit Ms receives the output of sample-and-hold circuit Hs and coefficient $a_j$ stored in $A_1$. Then, the output voltage of $H_1$ and the multiplier stored in $A_1$ are multiplied in Ms—originally the multiplication is performed in $M_1$—and adder ADD receives the results at this timing.

At the timing $H_1$ is refreshed (any timing from 5 to 8), its corresponding multiplication circuit $M_1$ is simultaneously refreshed by receiving high-level control signal ref from the control circuit (not shown). Here, the output from $M_1$ is Vref, which is the 0-input to ADD, and which gives no influence to the output of ADD.

At sampling timings from 6 to 8, sampling and holding and multiplication are sequentially executed using sample-and-hold circuits $H_2$ to $H_4$ and Hs, and multiplication circuits $M_2$ to $M_4$ and Ms. At sampling timing 9, normal processing is performed using $H_1$ completed its refreshing, and $M_1$.

At sampling timing 14, at which time $H_2$ is originally driven, Hs is driven to refresh $H_2$ and $M_2$, as above. $H_1$ to $H_4$ and $M_1$ to $M_4$ are sequentially refreshed in this way.

As shown in (10) in FIG. 14, Hs and Ms are refresh-capable at timings 9 to 13 and 18 to 22 when $H_1$ to $H_4$ and $M_1$ to $M_4$ are used.

When AD1 and AD2 (or the addition circuit and holding circuit in FIG. 9(b)) are alternately used synchronously to once-through refreshing of $H_1$ to $H_4$ and $M_1$ to $M_4$, the one not in use can be refreshed.

Although $H_1$ to $H_4$ are refreshed by the sampling cycle of (2×4(=filter stage number)+1), other cycles are feasible. A larger cycle means fewer refresh operations and thus lower power consumption. However, the cycle is limited due to the residual charge caused by the leakage in the analog operation circuit.

As mentioned, because it includes refreshing means, the present invention can avoid lowered output accuracy caused by the residual charge in the analog operation circuit. Also, it is possible to refresh sample-and-hold circuits and multiplication circuits without decreasing processing speed and with minimal hardware increase because an auxiliary sample-and-hold circuit and an auxiliary multiplication circuit are commonly provided to multiple sample-and-hold circuits and multiplication circuits.

What is claimed is:

1. A matched filter comprising:
   an analog-to-digital converter configured for sampling and converting an input signal into purely digital data;
   a shift register having a predetermined number of stages and being configured for receiving the purely digital data, each stage producing shifted digital data as an output, the shifted digital data having a predetermined number of bits;
   a predetermined number of EXCLUSIVE-OR circuits, each EXCLUSIVE-OR circuit corresponding to one of the stages, and being configured for (i) receiving the shifted digital data as one input and receiving a corresponding bit of a spread code as another input, (ii) multiplying the shifted digital data and the corresponding bit of the spread code, and (iii) producing a purely digital product representative of the multiplication; and
   an analog adder configured for adding the purely digital products of said predetermined number of EXCLUSIVE-OR circuits.

2. A matched filter as claimed in claim 1, wherein said analog adder includes a number of analog addition circuits, the number of analog addition circuits corresponding to the predetermined number of bits, the analog addition circuits being configured for receiving bits having weights corresponding to the purely digital products.

3. A matched filter as claimed in claim 1, wherein said analog-to-digital converter includes a predetermined number of threshold circuits, each including a capacitive coupling, an inverting amplifier, and an encoder, the encoder being configured for receiving outputs of said threshold circuits.

4. A filter circuit comprising:
   a plurality of sample-and-hold circuits configured for successively sampling and holding input analog signals, each sample-and-hold circuit producing an output;
   a cyclic shift register configured for storing coefficient data corresponding to each output;
   a plurality of analog multiplication circuits configured for multiplying the outputs from said plurality of sample-and-hold circuits and the coefficient data from said cyclic shift register, thus producing multiplication circuit outputs;
   an analog addition circuit configured for calculating sums of said multiplication circuit outputs;
   wherein said plurality of sample-and-hold circuits, multiplication circuits and addition circuits each includes refreshing means for eliminating effects of residual charges; and
   an auxiliary sample-and-hold circuit, an auxiliary multiplication circuit and an auxiliary addition circuit, each configured for (i) eliminating the effects of residual charges and (ii) respectively continuing a function of said sample-and-hold circuits, said multiplication circuits, and said addition circuit while the effects of residual charges are being eliminated.

5. A filter circuit as claimed in claim 4, wherein said auxiliary sample-and-hold circuit and said auxiliary multiplication circuit are commonly provided to said plurality of sample-and-hold circuits and said plurality of multiplication circuits, respectively.

6. A filter circuit as claimed in claim 4, wherein said auxiliary sample-and-hold circuit, auxiliary multiplication circuit and auxiliary addition circuit include refreshing means for canceling offset voltages caused by the residual charge.

7. A filter circuit as claimed in claim 4, wherein:
   each said sample-and-hold circuit, said multiplication circuit, said addition circuit, said auxiliary sample-and-hold circuit, said auxiliary multiplication circuit and said auxiliary addition circuit includes an inverting amplifier having an odd number of stages of serially connected CMOS inverters, an input capacitor connected to the input of said inverting amplifier, and a feedback capacitor connected between the input and output of said inverting amplifier; and
   said refreshing means includes switching means for short-circuiting said feedback capacitor, and means for supplying the reference voltage to the input of said input capacitor.

8. A filter circuit as claimed as in claim 4, wherein:

each said sample-and-hold circuit, said multiplication circuit, said addition circuit, said auxiliary sample-and-hold circuit, said auxiliary multiplication circuit and said auxiliary addition circuit includes an inverting amplifier having an odd number of stages of serially connected CMOS inverters, an input capacitor connected to the input of said inverting amplifier, and a feedback capacitor connected between the input and output of said inverting amplifier; and said refreshing means includes switching means for short-circuiting said feedback capacitor, and means for supplying the reference voltage to the input of said input capacitor and the output of said feedback capacitor.

* * * * *